US012787408B2

(12) United States Patent
Wu et al.

(10) Patent No.: US 12,787,408 B2
(45) Date of Patent: Nov. 3, 2026

(54) VIAS AND VIA RAILS FOR SOURCE/DRAIN METAL FULL CONTACT

(71) Applicant: Taiwan Semiconductor Manufacturing Company, Ltd., Hsin-Chu (TW)

(72) Inventors: Wei-Hao Wu, Hsinchu City (TW); Kuan Chen, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 538 days.

(21) Appl. No.: 18/329,166

(22) Filed: Jun. 5, 2023

(65) Prior Publication Data

US 2024/0405082 A1 Dec. 5, 2024

(51) Int. Cl.
*H10D 64/23* (2025.01)
*H10D 64/01* (2025.01)

(52) U.S. Cl.
CPC .......... *H10D 64/251* (2025.01); *H10D 64/01* (2025.01)

(58) Field of Classification Search
CPC .. H10D 64/251; H10D 64/01; H10D 84/0158; H01L 21/76801; H01L 21/76834; H01L 21/76897
See application file for complete search history.

(56) References Cited

U.S. PATENT DOCUMENTS

| | | | | |
|---|---|---|---|---|
| 8,772,109 | B2 | 7/2014 | Colinge | |
| 8,785,285 | B2 | 7/2014 | Tsai et al. | |
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 9,105,490 | B2 | 8/2015 | Wang et al. | |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 2020/0411378 | A1 * | 12/2020 | Huang | H01L 21/76802 |
| 2022/0359519 | A1 | 11/2022 | Chen et al. | |
| 2022/0376044 | A1 | 11/2022 | Yu et al. | |
| 2022/0406653 | A1 * | 12/2022 | Hsiung | H10D 30/6219 |
| 2023/0047598 | A1 * | 2/2023 | Hsiung | H10D 30/6211 |

* cited by examiner

*Primary Examiner* — Thanhha S Pham
(74) *Attorney, Agent, or Firm* — HAYNES AND BOONE, LLP

(57) ABSTRACT

One aspect of the present disclosure pertains to a method of forming a semiconductor device. The method includes receiving a workpiece having a first metal gate stack over a first channel region, a second metal gate stack over a second channel region, a source/drain (S/D) feature between the first and second channel regions, and an S/D contact over the S/D feature. First and second dielectric caps are formed over the first and second metal gate stacks and a contact etch stop layer (CESL) is formed over the S/D contact and over the first and second dielectric caps. An interlayer dielectric (ILD) layer is formed over the CESL and an S/D via trench is formed through the ILD layer and the CESL. An S/D via is formed in the S/D via trench, making full surface contact with the S/D contact and partial surface contact with the first and second dielectric caps.

20 Claims, 17 Drawing Sheets

VIAS AND VIA RAILS FOR SOURCE/DRAIN METAL FULL CONTACT

BACKGROUND

The integrated circuit (IC) industry has experienced exponential growth. Technological advances in semiconductor manufacturing have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes.

However, as feature sizes continue to decrease, overlay and alignment control become limiting factors when forming different features on top of each other. For example, when forming a source/drain via over a source/drain metal contact, any mismatch in overlay shift would cause less than full contact between the source/drain via and the source/drain contact. Further, at nanometer dimensions for high density devices, an overlay shift could cause unwanted shorting between source/drain vias and the metal gates. To address overlay and alignment control, there is a need to improve contact resistance and to avoid coupling or short between metal gate and source/drain metal contacts. Therefore, although existing methods of forming source/drain vias have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1A:
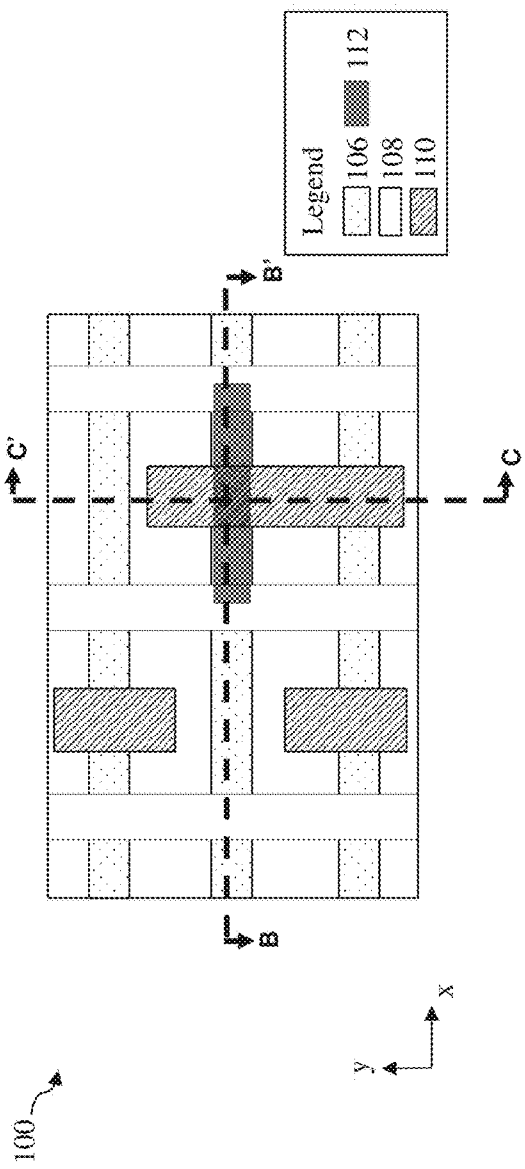
FIG. 1A illustrates a top view of a semiconductor device having a source/drain via according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for case of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with “about,” “approximate,” and the like, the term is intended to encompass numbers that are within a reasonable range including the number described, such as within +/−10% of the number described, or other values as understood by person skilled in the art. For example, the term “about 5 nm” may encompass the dimension range from 4.5 nm to 5.5 nm.

The present disclosure relates to methods and devices directed to source/drain (S/D) vias, including slot vias, via rails, and other vias landing on S/D metal contacts. As device features scale down, spacing between metal gates and the adjacent S/D features becomes tighter. As such, any misalignment in the formation of S/D vias over the S/D metal contacts may cause increased contact resistance due to partial landing instead of full contact landing. Further, misalignment may cause current leakage issues due to possible short between the gate and the S/D features. For example, when forming an S/D via trench, the metal gate might be exposed due to etching with overlay error. And when filling in the source/drain via, there may be unwanted coupling between the metal gate and the source/drain via. To prevent leakage and the possibility of shorting gate and source/drain connections, the present disclosure provides solutions for full contact landing and for proper insulation between S/D features and the metal gates. For example, the S/D vias are elongated as slot vias having portions directly over the metal gates, and a contact etch stop layer is used to prevent undesired etching over the metal gates when forming the S/D vias. For another example, the S/D vias are formed as S/D via rails that extend over several metal gates and contacting several S/D contacts. For another example, in processes related to static random access memory (SRAM) devices, the process of forming shared butted contacts between metal gate and source/drain contacts is eliminated. Instead, S/D vias are formed to directly land on gate vias, thereby reducing manufacturing costs.

To illustrate the various aspects of the present disclosure, methods of forming a semiconductor device are discussed below. Embodiments shown in the present disclosure may be implemented by Gate-All-Around (GAA) field effect transistors (FETs), but the present disclosure is not limited thereto. For example, the present disclosure may also be implemented with fin FETs or other types of transistors. Those of ordinary skill in the art should appreciate that they may readily use the present disclosure as a basis for designing or modifying other structures for carrying out the same purposes and/or achieving the same advantages of the embodiments introduced herein.

FIG. 1A illustrates a top view of a semiconductor device 100 having a source/drain via 112 according to an embodiment of the present disclosure. The semiconductor device 100 may be a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device is included in a non-volatile memory, such as a non-volatile random access memory (NVRAM) or static random access memory (SRAM), a flash memory, an electrically erasable programmable read only memory (EEPROM), an electrically programmable read-only memory (EPROM), other suitable memory type, or combinations thereof.

Still referring to FIG. 1A, the semiconductor device 100 includes active regions 106 extending lengthwise along the x direction and metal gate structures 108 extending lengthwise along the y direction. The metal gate structures 108 are disposed over channel regions 106*a* (see FIG. 1B) of the active regions 106. Between the channel regions 106*a* are source/drain (S/D) regions 106*b* (see FIG. 1B) of the active regions 106. The S/D regions 106*b* are disposed between adjacent metal gate structures 108. S/D contacts 110, also referred to as S/D metal contacts, are disposed over the S/D regions 106*b*. The S/D contacts 110 land on S/D features of the S/D regions 106*b*. The S/D contacts 110 may extend lengthwise along the y direction in parallel to the metal gate structures 108. In some embodiments, the S/D contacts 110 may extend to land on multiple S/D regions 106*b* in different active regions 106. In other embodiments, the S/D contacts 110 may only land on an S/D region of a single active region 106. An S/D via 112 is disposed over and landing on an S/D contact 110. The S/D via 112 may extend lengthwise along the x direction in parallel to the active regions 106. The S/D via 112, also referred to as a slot via, makes full surface contact with the top of the S/D contact 110 and may extend to be directly above portions of the gate structures 108 on each side of the S/D contact 110. Although FIG. 1A only shows one S/D via 112, the present disclosure is not limited thereto. For example, the semiconductor device 100 may include additional S/D vias 112 landing on additional S/D contacts 110.

Figure 1B:
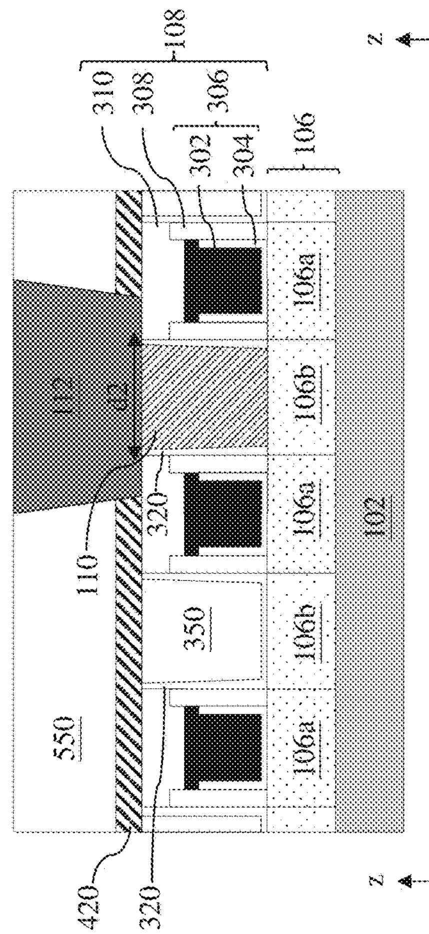
FIGS. 1B-1C illustrate cross-sectional views of the semiconductor device in FIG. 1A, cut along the lines B-B' and C-C', respectively, according to an embodiment of the present disclosure.

FIG. 1B illustrates a cross-sectional view of the semiconductor device 100 in FIG. 1A cut along the line B-B'. FIG. 1B is briefly described below. Additional details will be provided when describing method 200 of FIG. 2 in view of FIGS. 3-8. As shown in FIG. 1B, an active region 106 is disposed over a substrate 102. The active region 106 includes channel regions 106*a* and source/drain regions 106*b*. Metal gate structures 108 are disposed directly over the channel regions 106*a*. The channel regions 106*a* for a GAA FET may include a stack of transistor channels. The channel regions 106*a* for a fin FET may include a single fin-shaped transistor channel. The source/drain regions 106*b* may include source/drain epitaxial features doped with n-type or p-type dopants. Each of the metal gate structures 108 includes a gate stack 306, gate spacers 308 on sidewalls of the gate stack 306, and a gate dielectric cap 310 over the gate stack 306 and over the gate spacers 308. The gate dielectric caps 310 directly land on and cover top surfaces of the gate stacks 306 and the gate spacers 308. Each of the gate stacks 306 includes a gate dielectric layer 304 and a gate electrode 302. The gate electrode 302 may include a top portion over a bottom portion. The top portion of the gate electrode 302 may be wider in the x direction and covers top surfaces of the gate dielectric layer 304. The gate spacers 308 may be taller in height than the gate stacks 306 in the z direction. As such, the gate dielectric caps 310 may be T-shaped, having a bottom portion between opposing side surface of the gate spacers 308 and a top portion over top surfaces of the gate spacers 308.

Still referring to FIG. 1B, a source/drain (S/D) contact 110 may be formed over and landing on the S/D region 106*b*. The S/D contact 110 is disposed between metal gate structures 108. The S/D contact 110 may be lined by first contact etch stop layers (CESLs) 320 along its sidewalls. The first CESLs 320 are also on sidewalls of the metal gate structures 108 and they isolate the metal gate structures 108 from the S/D contact 110. In some embodiments, if no S/D contacts 110 are formed over the respective S/D regions 106*b*, a first interlayer dielectric (ILD) layer 350 is disposed over these S/D regions 106*b*. These S/D regions 106*b* are also lined with the first CESLs 320, where the first CESLs 320 surround side and bottom surfaces of the first ILD layer 350.

Still referring to FIG. 1B, a second CESL 420 is disposed over the gate structures 108, the first CESLs 320, and the first ILD layer 350. The second CESL 420 is different from the first CESLs 320 in material composition. The second CESL 420 is also different from the dielectric caps 310 in material composition. A second ILD layer 550 is disposed over the second CESL 420. The first and second ILD layers 350 and 550 may have a same material composition. An S/D via 112 may be formed through the second ILD layer 550 and the second CESL 420 to land on the S/D contact 110. The S/D via 112 makes full direct contact with the top surface of the S/D contact 110 and partial contact with top surfaces of the gate dielectric caps 310. The S/D via 112 has a length d1 in the x direction and the S/D contact 110 has a width d2 in the x direction. The length d1 is greater than the width d2, and a ratio of d1 to d2 is greater than 2. The ratio of d1 to d2 is greater than 2 to ensure full contact landing between the top surface of the S/D contact 110 and the bottom surface of the S/D via 112. For example, the ratio of d1 to d2 is about 3.

Figure 1C:
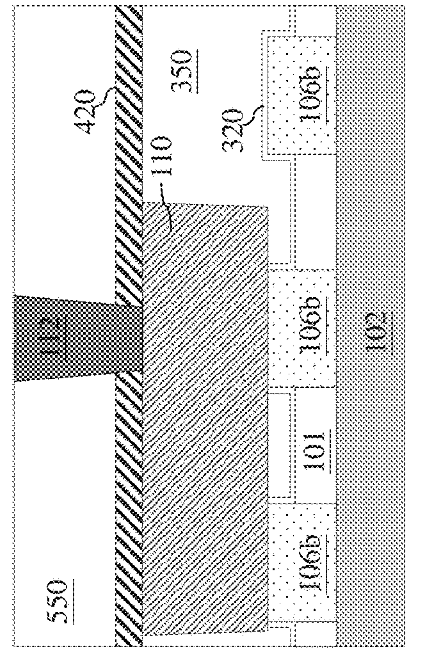

FIG. 1C illustrates a cross-sectional view of the semiconductor device 100 in FIG. 1A cut along the line C-C'. In this view, an isolation structure 101 is disposed over the substrate 102. The isolation structure 101, such as a shallow trench isolation (STI), interpose and isolate adjacent S/D regions 106*b* along the y direction. The first CESLs 320 may land on the isolation structure 101 and land conformally on portions of the S/D regions 106*b*. The first ILD layer 350 is disposed over the first CESLs 320, which itself is disposed over the S/D regions 106*b* and the isolation structure 101. The S/D contact 110 penetrates through the first ILD layer 350 and the first CESLs 320 to land on S/D features of multiple S/D regions 106*b*. The second CESL 420 lands on the S/D contact 110 and on a top surface of the first ILD layer 350. The second ILD layer 550 lands on the second CESL 420. The S/D via 112 penetrates through the second ILD layer 550 and the second CESL 420 to land on the S/D contact 110. In this view, the S/D via 112 has a width d3 in the y direction, and the width of the S/D via 112 is shorter than a length of the S/D contact 110 in the y direction. In an embodiment, d3 has similar dimensions to d2. As such, a ratio of the length d1 to the width d3 should also be greater than 2. For example, the ratio of d1 to d3 is about 3.

Figure 2:
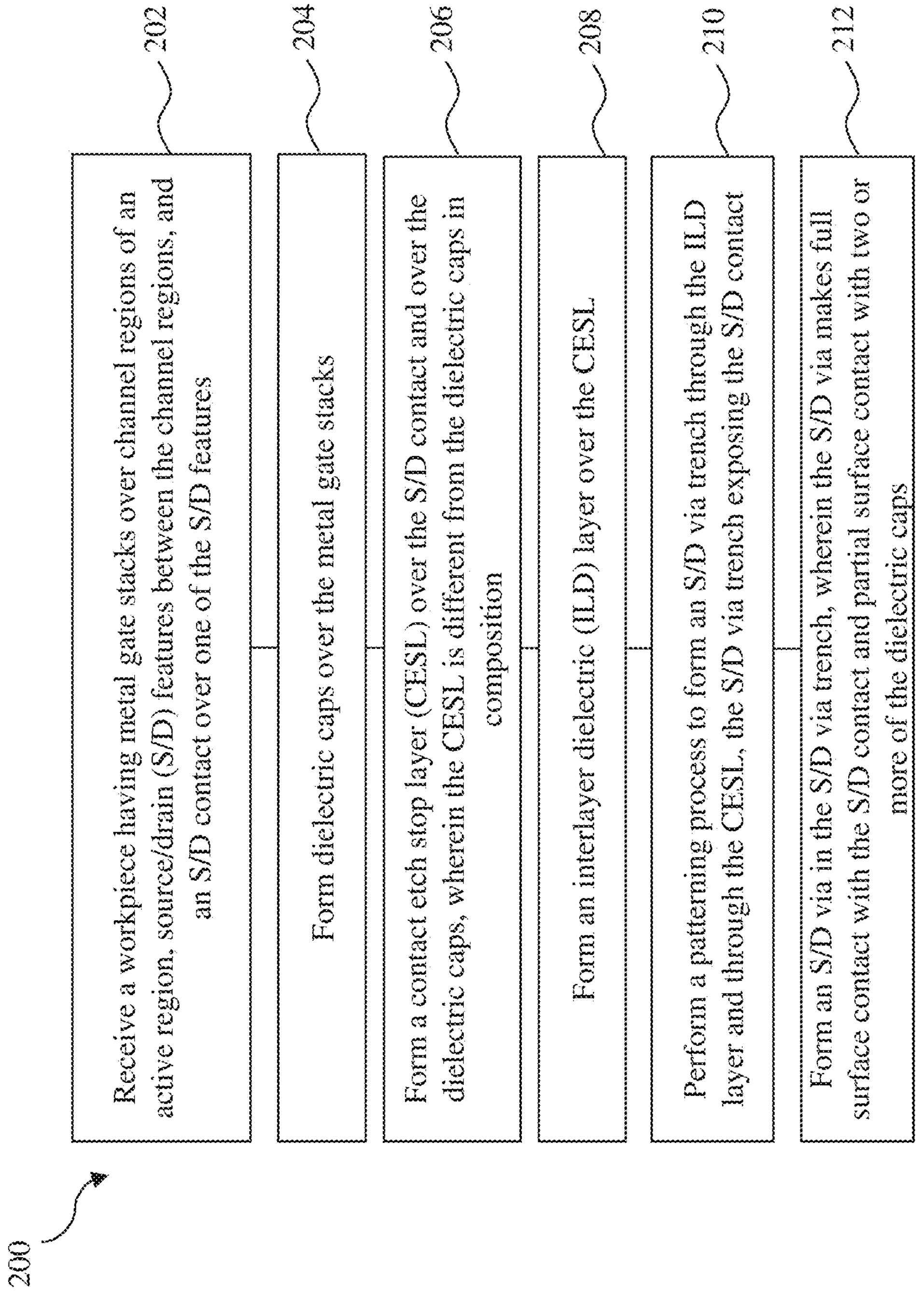
FIG. 2 is a flow chart of a method to form a semiconductor device having a source/drain via, in portion or in entirety, according to various aspects of the present disclosure.

FIG. 2 is a flow chart of a method 200 to form a semiconductor device 100 having a source/drain via 112, in portion or in entirety, according to various aspects of the present disclosure. The method 200 is briefly described below. At operation 202, the method 200 receives or is provided with a workpiece that includes metal gate stacks over channel regions of an active region. The workpiece also includes source/drain (S/D) features between the channel regions and an S/D contact over one of the S/D features. The active region includes channel regions and S/D regions, and the source/drain regions include the S/D features. At operation 204, the method 200 forms dielectric caps (or gate dielectric caps) over the metal gate stacks. At operation 206, the method 200 forms a contact etch stop layer (CESL) over the S/D contact and over the dielectric caps, where the CESL is different from the dielectric caps in composition. At operation 208, the method 200 forms an interlayer dielectric (ILD) layer over the CESL. At operation 210, the method 200 performs a patterning process to form an S/D via trench through the ILD layer and through the CESL. The S/D via trench exposes a top surface of the S/D contact. At operation 212, the method 200 forms an S/D via in the S/D via trench. The S/D via makes full surface contact with the S/D contact and partial surface contact with two or more of the dielectric caps. Additional processing is contemplated by the present disclosure. Additional operations can be provided before, during, and after method 200, and some of the operations described can be moved, replaced, or eliminated for additional embodiments of method 200.

FIGS. 3-8 illustrate cross-sectional views of a semiconductor device 100 cut along the lines B-B' in FIG. 1A at intermediate stages of fabrication and processed in accordance with the method 200 of FIG. 2 according to an embodiment of the present disclosure. These figures have been simplified for the sake of clarity to better understand the inventive concepts of the present disclosure. Additional features can be added in the device 100, and some of the features described below can be replaced, modified, or eliminated in other embodiments of the device 100.

Figure 3:
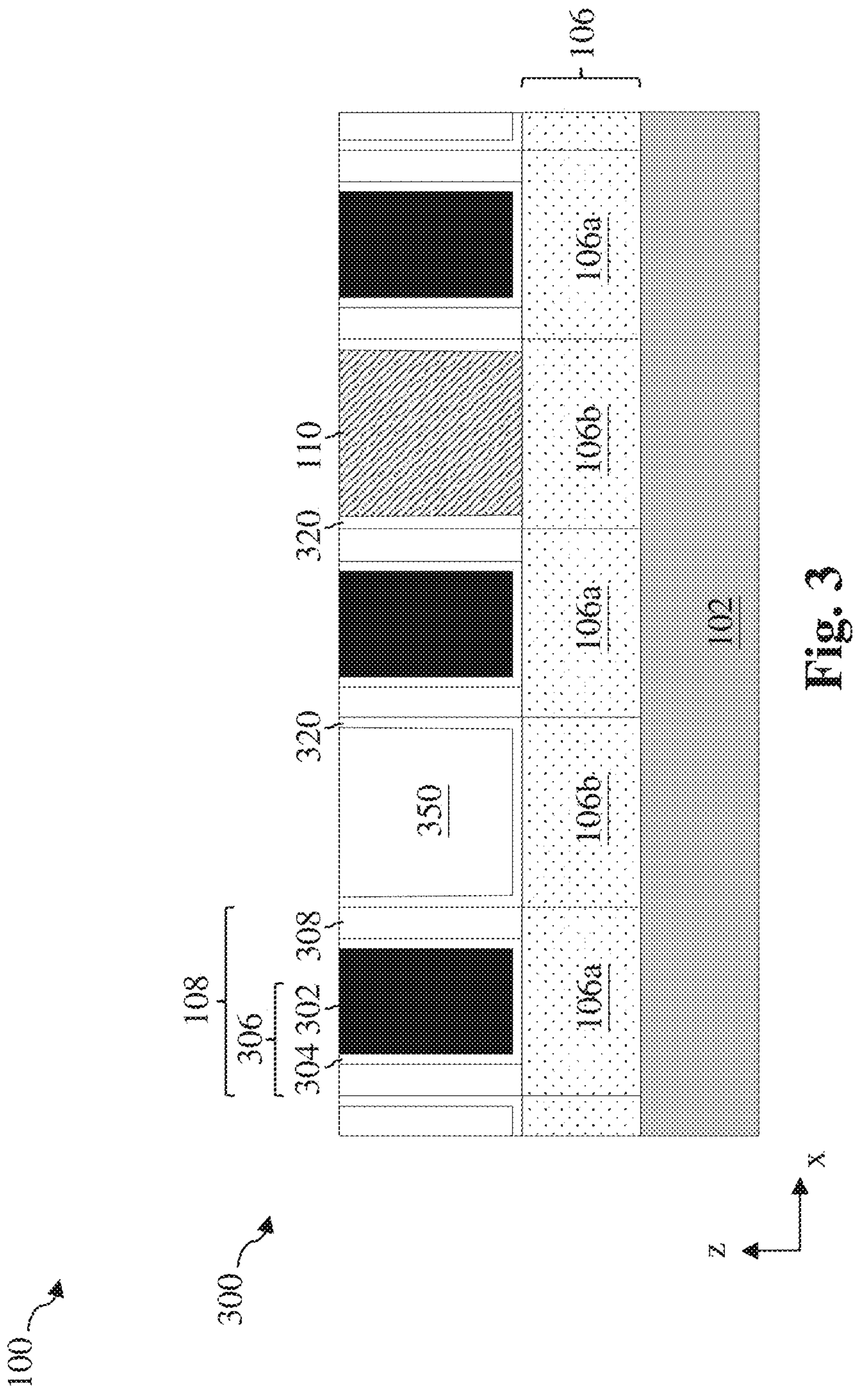
FIGS. 3-8 illustrate cross-sectional views of a semiconductor device cut along the lines B-B' in FIG. 1A at intermediate stages of fabrication and processed in accordance with the method of FIG. 2 according to an embodiment of the present disclosure.

At operation 202, the method 200 receives a workpiece 300 of the semiconductor device 100, an embodiment of which is illustrated in FIG. 3. The workpiece 300 may include a substrate 102 and an active region 106 over the substrate. The substrate 102 may be a silicon (Si) substrate, or a substrate having other semiconductor materials such as germanium (Ge), silicon carbide (SiC), silicon germanium (SiGe), or diamond. The active region 106 may be an extension of the substrate 102 that protrudes from the substrate 102. As described above, the active region 106 includes channel regions 106*a* under metal gate structures 108 and S/D regions 106*b* between channel regions 106*a*. At this stage of fabrication, the metal gate structures 108 include metal gate stacks 306 and gate spacers 308 along sidewalls of the metal gate stacks 306.

The gate spacers 308 may be made of silicon oxide, silicon nitride, silicon oxycarbide, silicon oxycarbonitride, silicon carbonitride, metal nitride, or a suitable dielectric material. FIG. 3 shows single layered gate spacers 308 along sidewalls of the metal gate stacks 306, but the present disclosure is not limited thereto. For example, the gate spacers 308 may be multilayered, and each layer may have different materials for specific design considerations such as etch protection and isolation.

Each of the metal gate stacks 306 includes a gate dielectric layer 304 and a gate electrode 302 disposed on the gate dielectric layer 304. In some embodiments, the gate dielectric layer 304 includes an interfacial layer and a high-k dielectric layer disposed on the interfacial layer. As shown, the gate dielectric layer 304 wraps around the gate electrode 302. The gate electrode 302 may be formed by any suitable deposition process, such as ALD, CVD, PVD, HDPCVD, MOCVD, RPCVD, PECVD, LPCVD, ALCVD, APCVD, spin coating, plating, other deposition process, or combinations thereof. The gate electrode 302 may include one or more conductive materials, such as a work function metal layer, a metal fill layer, and/or other proper conductive material layers. The work function layers (if present) may be same or different and may be an n-type work function layer or a p-type work function layer. The gate dielectric layer 304 includes a high-k dielectric material, such as materials having a dielectric constant greater than silicon oxide (k~3.9). Each of the gate electrodes 302 includes a suitable conductive material, such as aluminum (Al), tungsten (W), cobalt (Co), and/or copper (Cu). Each gate electrode 302 may additionally or collectively include other metals, metal oxides, metal nitrides, other suitable materials, or combinations thereof. In Fin FET structures, the metal gate stacks 306 cover top and side surfaces of a fin-shaped channel in the channel regions 106*a*. In GAA FET structures, the gate stacks 306 completely wraps around vertically stacked transistor channels (not shown) in the channel regions 106*a*. In either case, the gate stacks 306 include portions disposed directly above and over the channel regions 106*a*.

The S/D regions 106*b* includes S/D features epitaxially grown from the substrate 102 and/or the channel regions 106*a*. The S/D features may include n-type S/D features that correspond with n-type transistor regions or p-type S/D features that correspond with p-type transistor regions. The S/D features may be formed by an epitaxy process using CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 102 and/or the channel regions 106*a*. In some embodiments, for the n-type transistors, epitaxial S/D features include silicon and can be doped with carbon, phosphorous, arsenic, other n-type dopant, or combinations thereof (for example, forming Si: C epitaxial source/drain features, Si: P epitaxial source/drain features, or Si:C:P epitaxial S/D features). In some embodiments, for the p-type transistors, epitaxial source/drain features include silicon germanium or germanium and can be doped with boron, other p-type dopant, or combinations thereof (for example, forming Si:Ge:B epitaxial source/drain features).

An S/D contact 110 is disposed over and directly lands on S/D features in an S/D region 106*b*. The S/D contact 110 may include silicide features and metal fill layers over the silicide features. The silicide features are disposed between the S/D features and the metal fill layers. The silicide features may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The metal fill layers over the silicide features may include titanium (Ti), ruthenium (Ru), copper (Cu), nickel (Ni), cobalt (Co), tungsten (W), tantalum (Ta), or molybdenum (Mo).

Lining sidewalls of the S/D contact 110 are first contact etch stop layers (CESLs) 320. The first CESLs 320 include dielectric materials such as silicon nitride and may include one or more layers. The first CESLs 320 are disposed between the S/D contact 110 and the gate spacers 308 along the x direction. The first CESLs 320 also line the surfaces of a first interlayer dielectric (ILD) layer 350 between metal gate structures 108. The first ILD layer 350 may include dielectric materials such as silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. For purposes of etch selectivity, the first ILD layer 350 includes a different material than the first CESLs 320. For example, the first ILD layer 350 is made of silicon oxide and the first CESLs 320 are made of silicon nitride. The first ILD layer 350 may be disposed over S/D regions 106*b* where no S/D contacts 110 are formed. In some embodiments (not shown), portions of the first ILD layer 350 still remains even after forming the S/D contact 110, where a portion of the first ILD layer 350 is disposed between the S/D contact 110 and the first CESLs 320.

Figure 4:
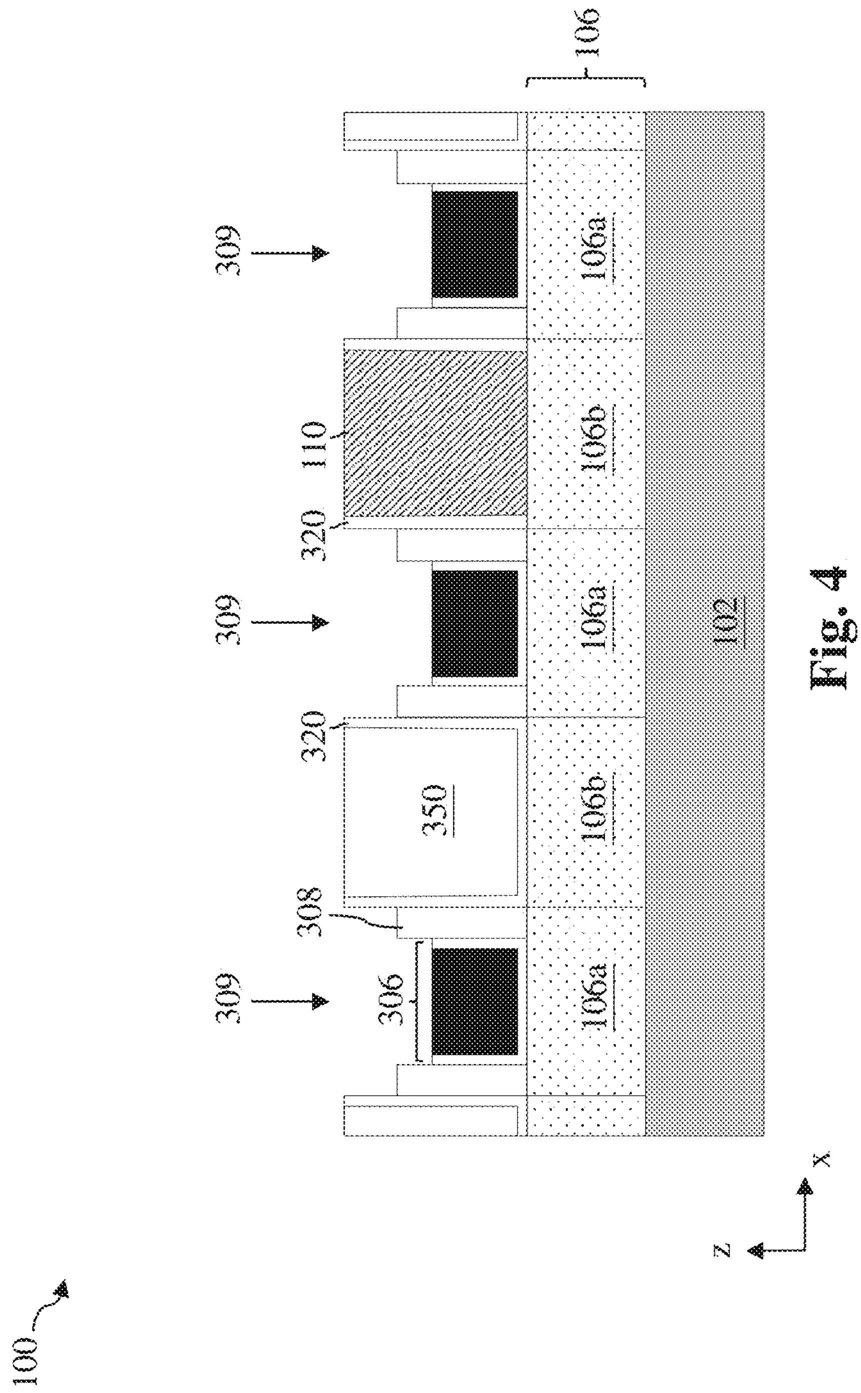
Figure 5:
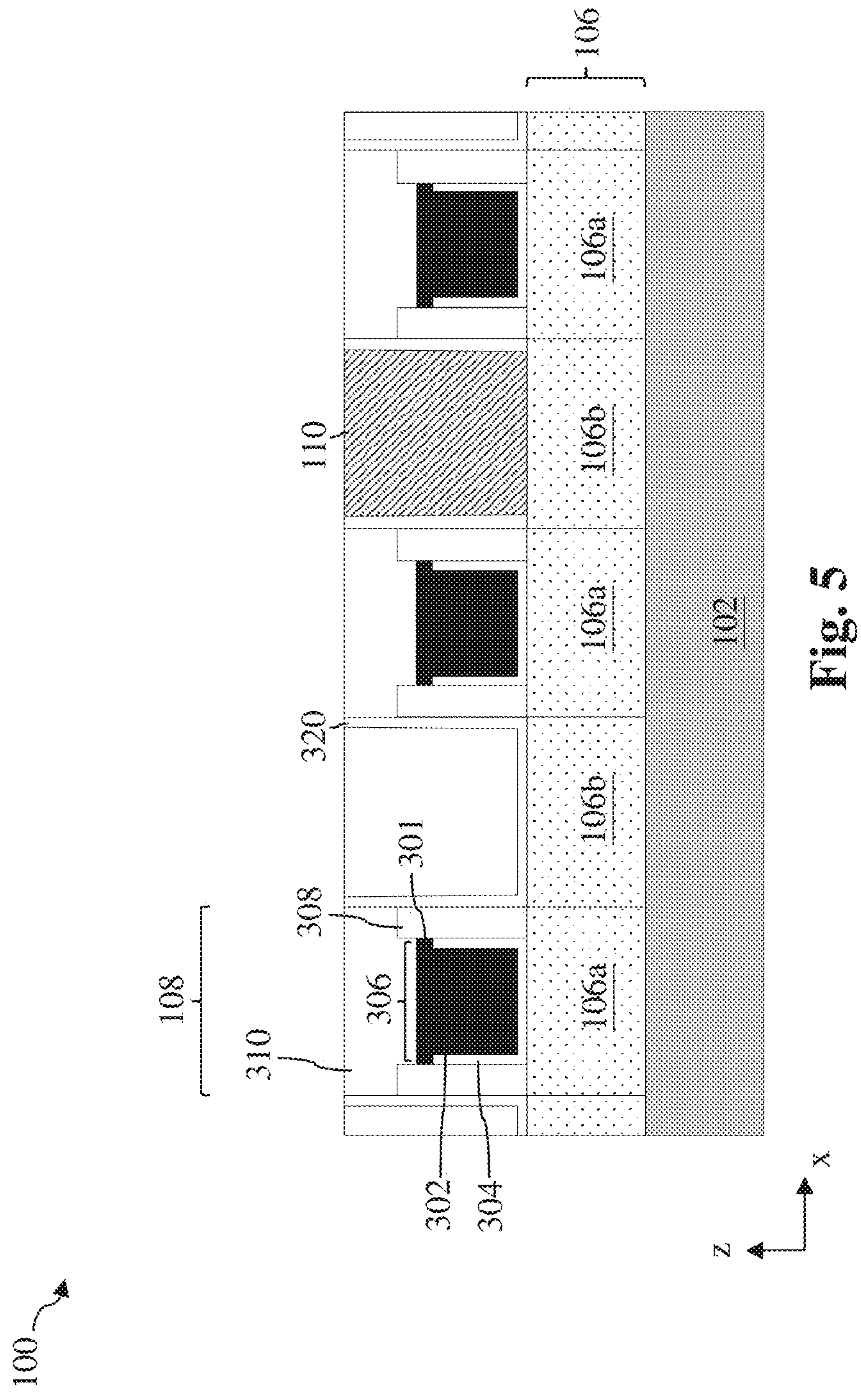

At operation 204, the method 200 forms dielectric caps 310 (or gate dielectric caps) over the metal gate stacks 306. FIGS. 4-5 illustrate example process steps of forming the dielectric caps 310. Referring to FIG. 4, dielectric cap trenches 309 are formed by etching top portions of the gate stacks 306 and top portions of the gate spacers 308. The etching process may be a dry etching process, a wet etching process, other suitable etching process, or combinations thereof. In some embodiments, the etching process is a multi-step etch process to separately etch the gate stack 306 and the gate spacers 308. In some embodiments, a lithography process is performed to form a patterned mask layer that covers the first ILD layer 350 and the S/D contact 110, and the etching process uses the patterned mask layer as an etch mask when forming the dielectric cap trenches 309. In any case, the gate stacks 306 and the gate spacers 308 are etched so that top surfaces of the gate stacks 306 and gate spacers 308 are below top surfaces of the first CESLs 320, the first ILD layer 350, and the S/D contact 110. In an embodiment, the gate stacks 306 are further etched below top surfaces of the gate spacers 308 to provide further isolation of the gate stacks 306 with other metal features in a later process step.

Now referring to FIG. 5, dielectric caps 310 are formed in the dielectric cap trenches 309. In an embodiment, before forming the dielectric caps 310, a conductive metal layer 301 such as a tungsten metal layer is deposited over the metal gate stack 306 and becomes part of the metal gate stack 306. Specifically, the conductive metal layer 301 becomes a top portion of the gate electrode 302. The top portion of the gate electrode 302 (i.e., the conductive metal layer 301) lands on top surfaces of the gate dielectric layer 304 and on side surfaces of opposing gate spacers 308. In this case, the top portion of the gate electrode 302 is wider than the bottom portion of the gate electrode 302 along the x direction, forming a T-shaped gate electrode 302. In an embodiment, the top surface of the T-shaped gate electrode 302 is still below the top surface of the gate spacers 308.

Still referring to FIG. 5, the dielectric caps 310 may be formed by a deposition process followed by a planarization process such as CMP. The deposition process may include processes such as CVD, PVD, ALD, HDPCVD, MOCVD, RPCVD, PECVD, LPCVD, ALCVD, APCVD, other suitable methods, or combinations thereof. Each of the dielectric caps 310 may be T-shaped, having a top portion and a bottom portion where the top portion is wider than the bottom portion along the x direction. The top portion of the dielectric cap 310 contacts top surfaces of the gate spacers 308, and the bottom portion of the dielectric cap 310 contacts top surfaces of the gate stacks 306. In an embodiment, the dielectric caps 310 and the first CESLs 320 are of the same material composition. In an embodiment, the dielectric caps 310 are made of silicon nitride. The dielectric caps 310 may be referred to as part of the metal gate structures 108, which also includes the metal gate stacks 306 and the gate spacers 308.

Figure 6:
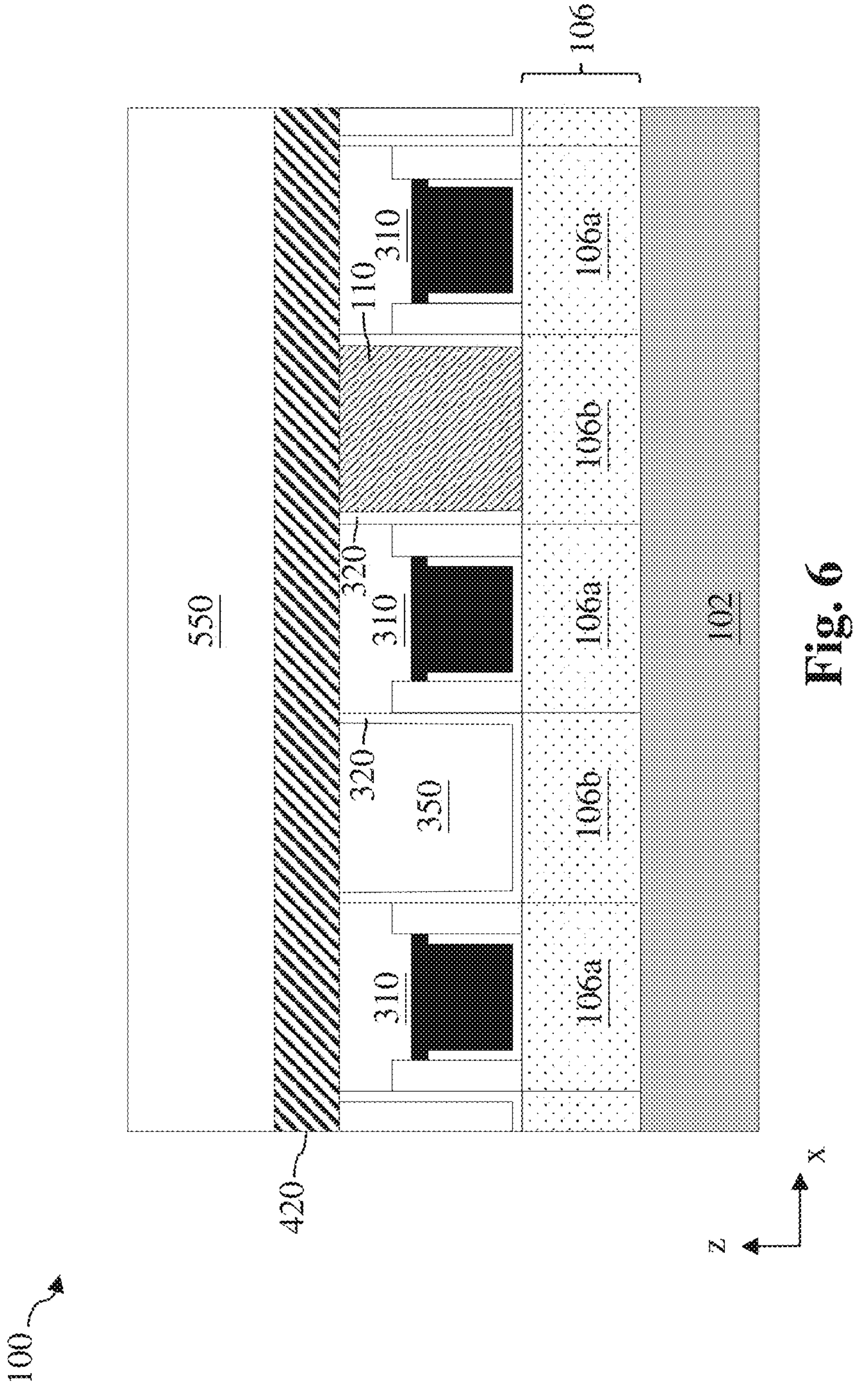

Now referring to FIG. 6, at operation 206, the method 200 forms a contact etch stop layer (CESL) 420 over the S/D contact 110 and over the dielectric caps 310, where the CESL 420 is different from the dielectric caps 310 in material composition. The CESL 420 may be formed by any suitable deposition process. The CESL 420, herein referred to as a second CESL 420, is also different in material composition from the first CESLs 320 and the first ILD layer 350. The second CESL 420 directly lands on top surfaces of the first ILD layer 350, the first CESLs 320, the dielectric caps 310, and the S/D contact 110. The material composition for the CESL 420 is chosen to have etch selectivity greater than 10 when compared to the other dielectric layers it is disposed on (e.g., dielectric caps 310, first CESLs 320, and first ILD layer 350). In an embodiment, the second CESL 420 includes carbon and the dielectric caps 310 and the first CESLs 320 are free of carbon. In an embodiment, the second CESL 420 includes oxygen and the dielectric caps 310 and the first CESLs 320 are free of oxygen. In an embodiment, the second CESL 420 is made of silicon carbonate (SiCO) or silicon carbonitride (SiCN), and the dielectric caps 310 and the first CESLs 320 are made of silicon nitride (SiN).

Still referring to FIG. 6, at operation 208, the method 200 forms an interlayer dielectric (ILD) layer 550, herein referred to as a second ILD layer 550, over the second CESL 420. The ILD layer 550 may be formed by a deposition process (such as CVD, PVD, ALD, HDPCVD, MOCVD, RPCVD, PECVD, LPCVD, ALCVD, APCVD, plating, other suitable methods, or combinations thereof). The second ILD layer 550 may have similar or the same material composition as the first ILD layer 350. For purposes of etch selectivity, the second ILD layer 550 is also different in material composition from the second CESL 420.

Figure 7:
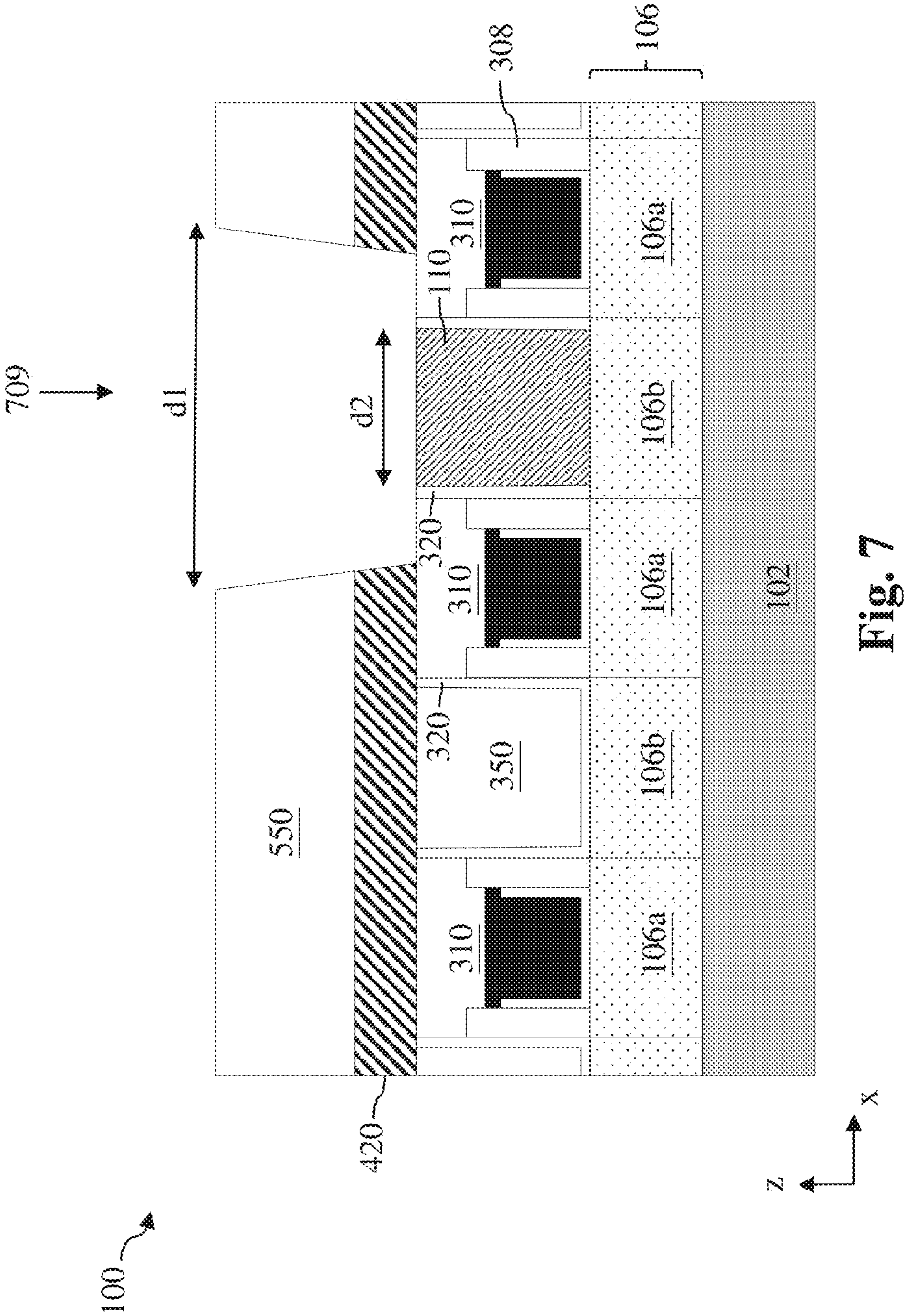

At operation 210, the method 200 performs a patterning process to form an S/D via trench 709 through the second ILD layer 550 and through the CESL 420, an embodiment of which is illustrated in FIG. 7. The patterning process may include one or more lithography and etching processes. In some embodiments, a lithography process is performed to form a patterned mask layer and an etching process uses the patterned mask layer as an etch mask when forming the S/D via trench 709. The etching process may include a multi-etch process to separately etch the second ILD layer 550 and the second CESL 420 due to differences in etching selectivity. For example, the patterning process may first perform an ILD etching process using an etchant that etches the ILD layer to exposes a top surface of the CESL. Then, the patterning process performs a selective etching process that uses a different etchant to selectively etch the second CESL 420 without substantially etching the dielectric caps 310 and the first CESLs 320. If the dielectric caps 310 and/or the first CESLs 320 are etched during the etching process, there is risk of etching too close to the gate electrodes 302 of the gate stacks 306, thereby causing unwanted coupling between later formed S/D vias and the metal gate stacks 306. Since the second CESL 420 has a different dielectric material (e.g., SiCO) from the dielectric caps 310 and the first CESLs 320, the over-etching issue to expose the metal gate stacks 306 is prevented. In an embodiment, the selective etching process uses an etchant having an etch selectivity greater than 10 when etching the second CESL 420 as compared to etching the dielectric caps 310 and the first CESLs 320. In an embodiment, the second CESL 420 also has a different material composition from the gate spacers 308. As such, the selective etching process also does not etch the gate spacers 308 due to difference in etching selectivity.

The S/D via trench 709 fully exposes a top surface of the S/D contact 110 and partially exposes top surfaces of gate dielectric caps 310 adjacent to the S/D contact 110. The S/D via trench 709 also exposes top surfaces of the first CESLs 320 lining sidewalls of the S/D contact 110. The S/D via trench 709 has a dimension d1 in the x direction, the S/D contact 110 has a dimension d2 in the x direction, where d1 is greater than d2. The S/D via trench 709 can be formed with a greater dimension d1 because the dielectric caps 310 acts as an etch stop layer to prevent over-etch into the gate stacks 306. The greater dimension d1 also ensures full surface contact between the later-formed S/D via 112 and the S/D contact 110. To ensure full surface contact, the ratio of d1 to d2 should be greater than 2, such as about 3.

Figure 8:
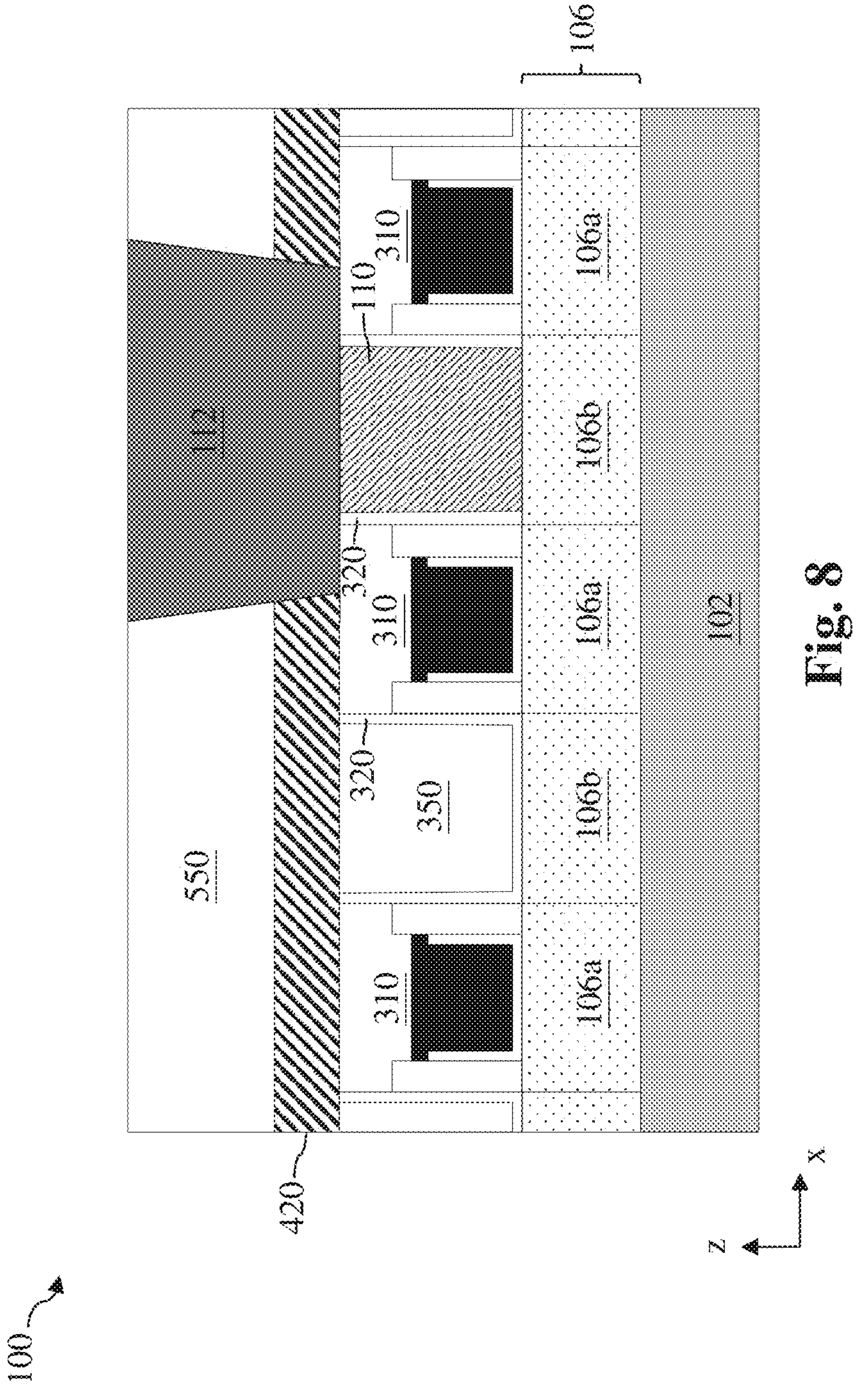

At operation 212, the method 200 forms an S/D via 112 in the S/D via trench 709, an embodiment of which is illustrated in FIG. 8. The S/D via 112 makes full surface contact with the top surface of the S/D contact 110 and partial surface contact with two or more of the dielectric caps 310. In the embodiment shown in FIG. 8, the S/D via 112 makes partial surface contact with the dielectric caps 310 adjacent to the S/D contact 110. The S/D via 112 also makes direct contact with top surfaces of the first CESLs 320. The S/D via 112 may include titanium (Ti), ruthenium (Ru), copper (Cu), nickel (Ni), cobalt (Co), tungsten (W), tantalum (Ta), molybdenum (Mo), or combinations thereof. In an embodiment, the S/D via 112 may include a conductive barrier layer 112*a* (not shown in FIG. 8 but shown in FIG. 17) and a metal fill layer over the conductive barrier layer 112*a*. The conductive barrier layer 112*a* acts as a glue layer and may include titanium, titanium nitride, tantalum, tantalum nitride, or a combination thereof. The metal fill layer may include titanium (Ti), ruthenium (Ru), copper (Cu), nickel (Ni), cobalt (Co), tungsten (W), tantalum (Ta), molybdenum (Mo), or combinations thereof. The S/D via 112 may be formed by first depositing the conductive barrier layer 112*a* in the S/D via trench 709, and then performing a CVD isotropic metal growth on the conductive barrier layer 112*a* to form the metal fill layer. In an embodiment, the metal fill layer deposited is tungsten.

Figure 9A:
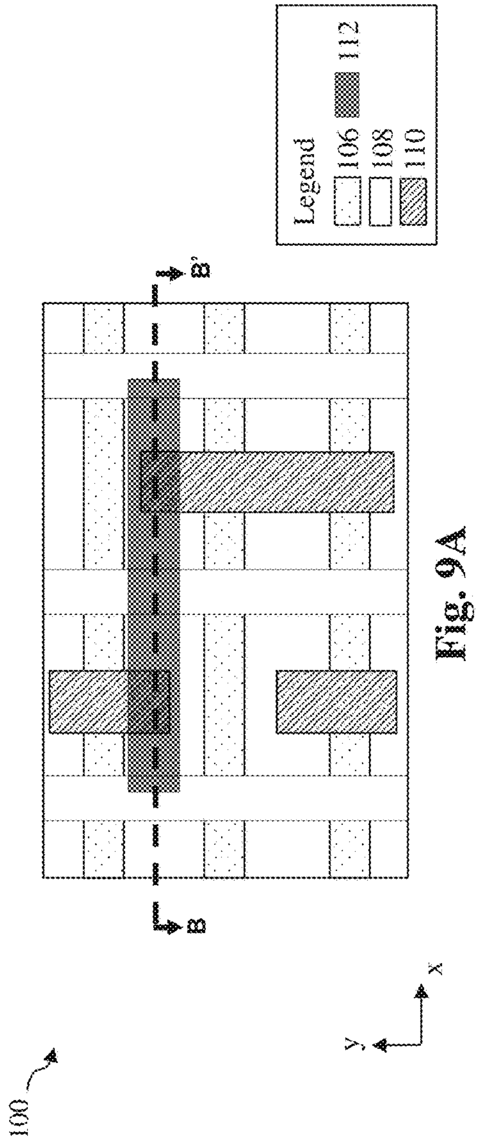
FIG. 9A illustrates a top view of a semiconductor device having a source/drain via rail according to an embodiment of the present disclosure.
Figure 9B:
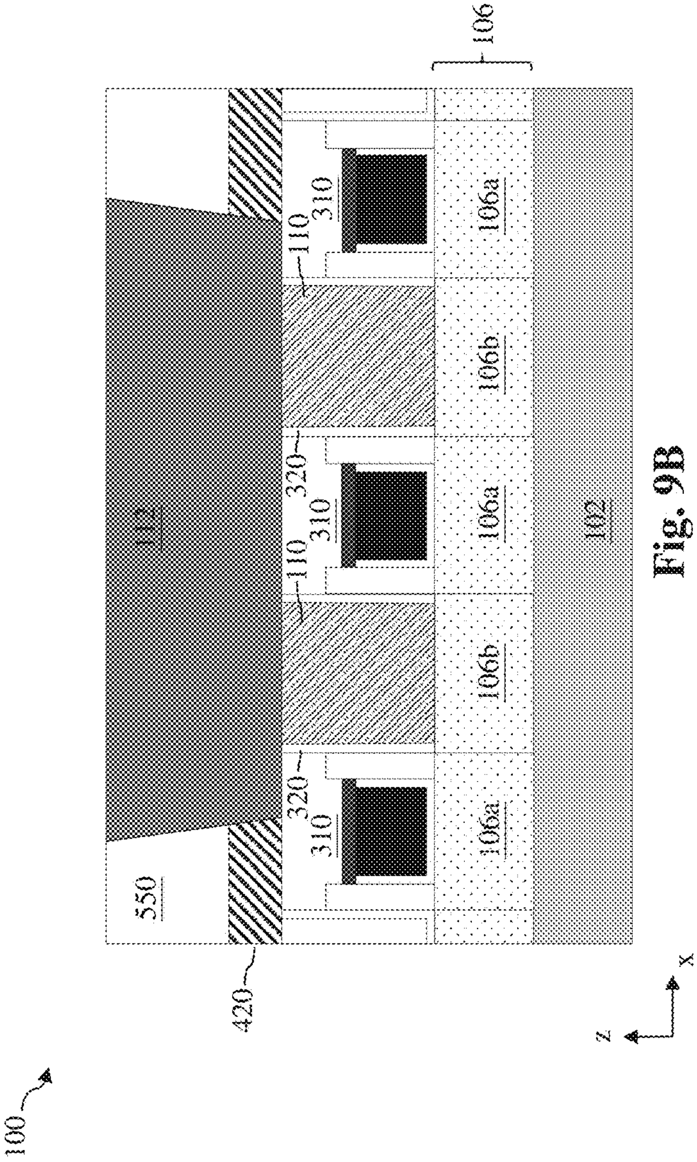
FIG. 9B illustrates a cross-sectional view of the semiconductor device in FIG. 9A cut along the lines B-B', according to an embodiment of the present disclosure.

The method 200 may perform further steps to complete fabrication of the semiconductor device 100. Additional operations can be provided before, during, and after method 200, such as forming another S/D via 112 over another S/D contact 110. Further, some of the operations described can be moved, replaced, or eliminated for additional embodiments of method 200. For example, FIGS. 9A and 9B illustrate top and cross-sectional views of a semiconductor device 100 according to another embodiment of the present disclosure. FIGS. 9A and 9B is similar to FIGS. 1A and 1B and the similar features will not be described for the sake of brevity. As shown, FIG. 9B illustrate a cross-sectional view of FIG. 9A cut along the lines B-B'. The difference here is that the S/D via 112 extends longer in the x direction, thereby making full surface contact with multiple S/D contacts 110. In this case, the S/D via 112 may be referred to as an S/D via rail and the S/D via rail makes full surface contact with at least one dielectric cap 310. Additional features may be formed over the S/D vias or via rails 112. These may include metal interconnects having metal lines that directly contact top surfaces of the the S/D vias or via rails 112.

Figure 10A:
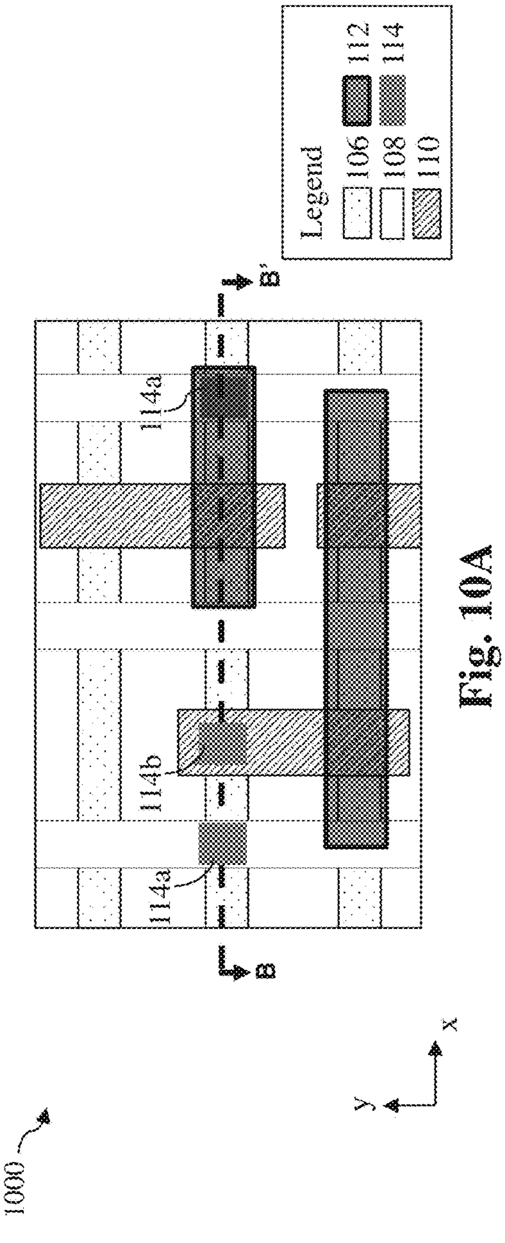
FIG. 10A illustrates a top view of a semiconductor device having source/drain vias and/or via rails according to another embodiment of the present disclosure.
Figure 10B:
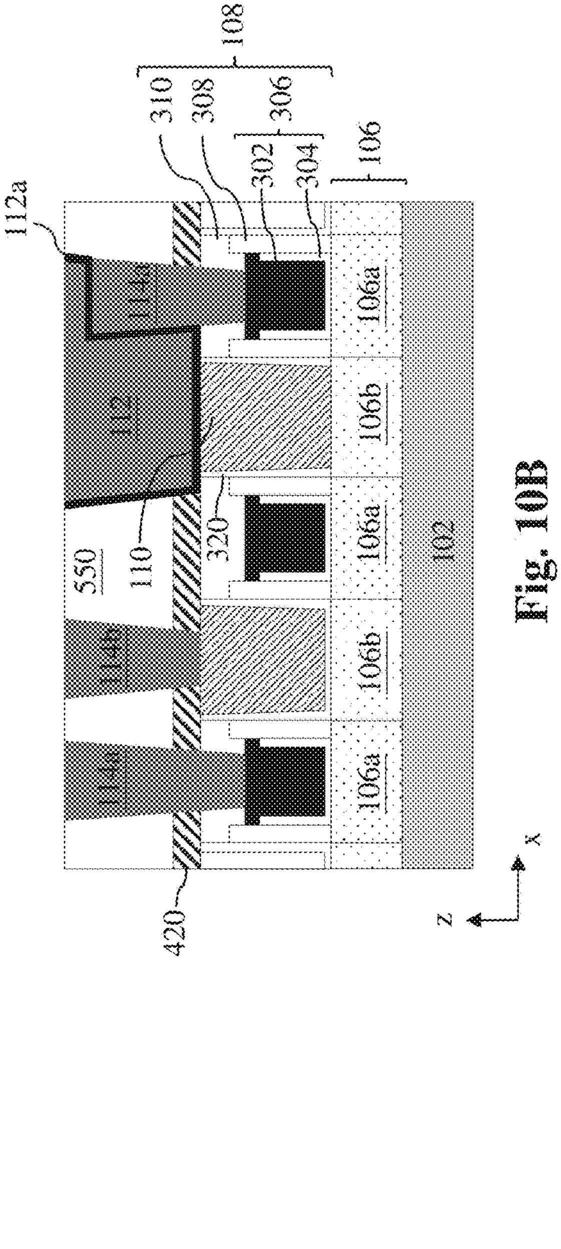
FIG. 10B illustrates a cross-sectional view of the semiconductor device in FIG. 10A cut along the lines B-B', according to an embodiment of the present disclosure.

In certain devices, such as SRAM, a metal interconnect often referred to as a shared butted contact is used to make electrical connection between gate and an adjacent S/D contact. In an embodiment of the present disclosure, the need to form a dedicated shared butted contact is eliminated in favor of forming extended S/D vias 112 that directly contact the gate, as shown in FIGS. 10A and 10B. FIGS. 10A and 10B illustrate top and cross-sectional views of a semiconductor device 1000 having source/drain vias 112 (and/or via rails 112). FIGS. 10A and 10B is similar to FIGS. 1A-1B and 9A-9B, and the similar features will not be described for the sake of brevity. FIG. 10B illustrate a cross-sectional view of FIG. 10A cut along the lines B-B'.

Referring to FIG. 10A, the semiconductor device 1000 illustrates two S/D vias 112. The S/D vias 112 have a thickened perimeter to indicate inclusion of a conductive barrier layer 112*a*, which will be explained below with respect to FIG. 15. As previously mentioned, the conductive barrier layer 112*a* may also be present in the embodiments previously described. FIG. 10A also show additional vias 114 directly over two of the metal gate structures 108 and one of the S/D contacts 110. The additional vias 114 do not have a conductive barrier layer 112*a*. The vias 114 include two gate vias 114*a* and an additional S/D via 114*b*. The S/D via 114*b* is different from the S/D vias 112 and may be herein referred to as a second S/D via 114*b* over a second S/D contact 110.

One of the S/D vias 112 (at the bottom of FIG. 10A) is a via rail much like the one shown in FIG. 9A. The other one of the S/D vias 112 is a via that connects a metal gate stack 306 of a metal gate structure 108 to an S/D contact 110 through a gate via 114*a*. This S/D via 112 is an S/D-to-gate via and may be herein referred to as a first S/D via 112. FIG. 10B illustrates a cross-sectional view of the semiconductor device 1000 in FIG. 10A cut along the lines B-B' through the first S/D via 112, according to an embodiment of the present disclosure. FIG. 10B share similar features to FIG. 1B, and the similar features will not be described for the sake of brevity.

As shown in FIG. 10B, gate vias 114*a* penetrates through the second ILD layer 550, the second CESL 420, and the dielectric caps 310. The gate vias 114*a* lands on respective top surfaces of the gate stacks 306 (specifically the gate electrodes 302). A first S/D via 112 directly lands on a first gate via 114*a* and an adjacent first S/D contact 110. The first S/D via 112 includes a conductive barrier layer 112*a* that lines side and top surfaces of the first gate via 114*a*. The first S/D via 112 electrical connects the first S/D contact 110 to the gate stack 306 directly contacting the first gate via 114*a*. The first S/D via 112 makes full surface contact with a top surface of the first S/D contact 110. A second S/D via 114*b* lands on a second S/D contact 110 but does not land on any gate vias 114*a*, nor does it make electrical connection to any gate stacks 306. A second gate via 114*a* is isolated from the second S/D via 114*b* by the second CESL 420 and the second ILD layer 550. In an embodiment, the second gate via 114*a* has a top surface above a top surface of the first gate via 114*a*. In an embodiment, the top surface of the second gate via 114*a* is substantially coplanar with a top surface of the first S/D via 112 and the second S/D via 114*b*. The first gate via 114*a* to the right, the second gate via 114*a* to the left, and the second S/D via 114*b* each have smaller widths in the x direction than the first S/D via 112. In an embodiment, due to the smaller widths, the first gate via, the second gate via, and the second S/D via 114*b* do not include conductive barrier layers 112*a* as these vias are formed differently compared to how the first S/D via 112 is formed.

Figure 11:
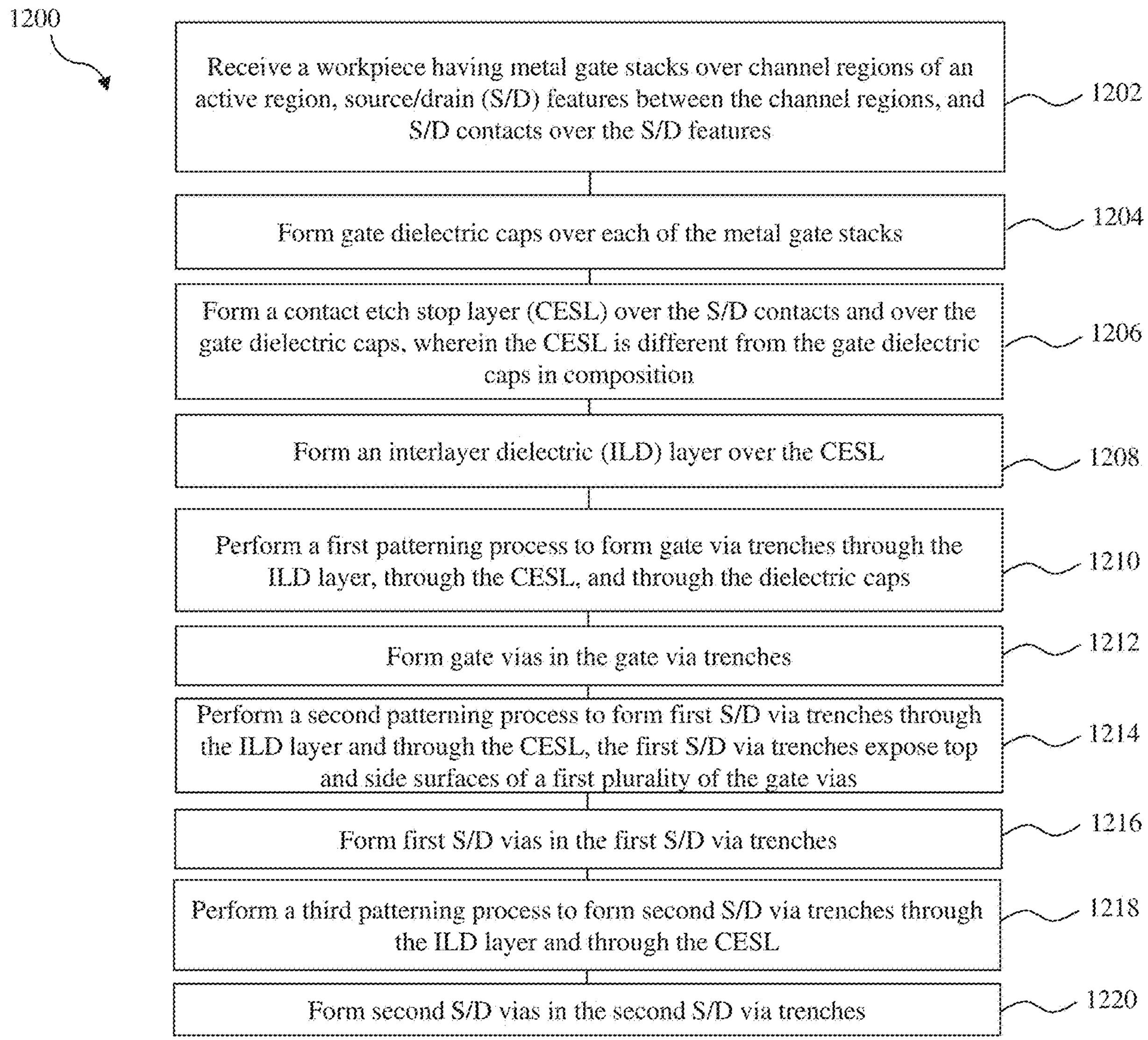
FIG. 11 is a flow chart of a method to form a semiconductor device having source/drain vias and/or via rails, in portion or in entirety, according to various aspects of the present disclosure.

FIG. 11 is a flow chart of a method 1200 to form a semiconductor device 1000 having source/drain vias 112 (and/or via rails 112), in portion or in entirety, according to various aspects of the present disclosure. Method 1200 is briefly described below. At operation 1202, the method 1200 receives or is provided with a workpiece that includes metal gate stacks over channel regions of an active region. The workpiece also includes source/drain (S/D) features between the channel regions and S/D contacts over the S/D features. The active region includes channel regions and S/D regions, and the source/drain regions include the S/D features. At operation 1204, the method 1200 forms dielectric caps (or gate dielectric caps) over the metal gate stacks. At operation 1206, the method 1200 forms a contact etch stop layer (CESL) over the S/D contacts and over the dielectric caps, where the CESL is different from the dielectric caps in composition. At operation 1208, the method 1200 forms an interlayer dielectric (ILD) layer over the CESL. At operation 1210, the method 1200 performs a first patterning process to form gate via trenches that exposes top surfaces of the metal gate stacks. At operation 1212, the method 1200 form gate vias in the gate via trenches. At operation 1214, the method 1200 performs a second patterning process to form first S/D via trenches through the ILD layer and through the CESL. The first S/D via trenches expose top and side surfaces of a first plurality of the gate vias. The first S/D via trenches also expose top surfaces of a first plurality of the S/D contacts. At operation 1216, the method 1200 forms first S/D vias in the first S/D via trenches. Each of the first S/D vias make full surface contact with one of the first plurality of the S/D contacts and partial surface contact with two or more of the dielectric caps. At operation 1218, the method 1200 performs a third patterning process to form second S/D via trenches through the ILD layer and through the CESL. The second S/D via trenches expose top surfaces of a second plurality of the S/D contacts. At operation 1220, the method 1200 forms second S/D vias in the second S/D via trenches. Additional processing is contemplated by the present disclosure. Additional operations can be provided before, during, and after method 1200, and some of the operations described can be moved, replaced, or eliminated for additional embodiments of method 1200.

FIGS. 12-17 illustrate cross-sectional views of a semiconductor device 1000 cut along the lines B-B' in FIG. 10A at intermediate stages of fabrication and processed in accordance with the method 1200 of FIG. 11 according to an embodiment of the present disclosure. Operations 1202 to 1208 in method 1200 is substantially similar to the operations 202 to 208 in method 200. Since these operations have been previously described, the method of 1200 is described starting at the end of operation 1218 with reference to FIG. 12.

Figure 12:
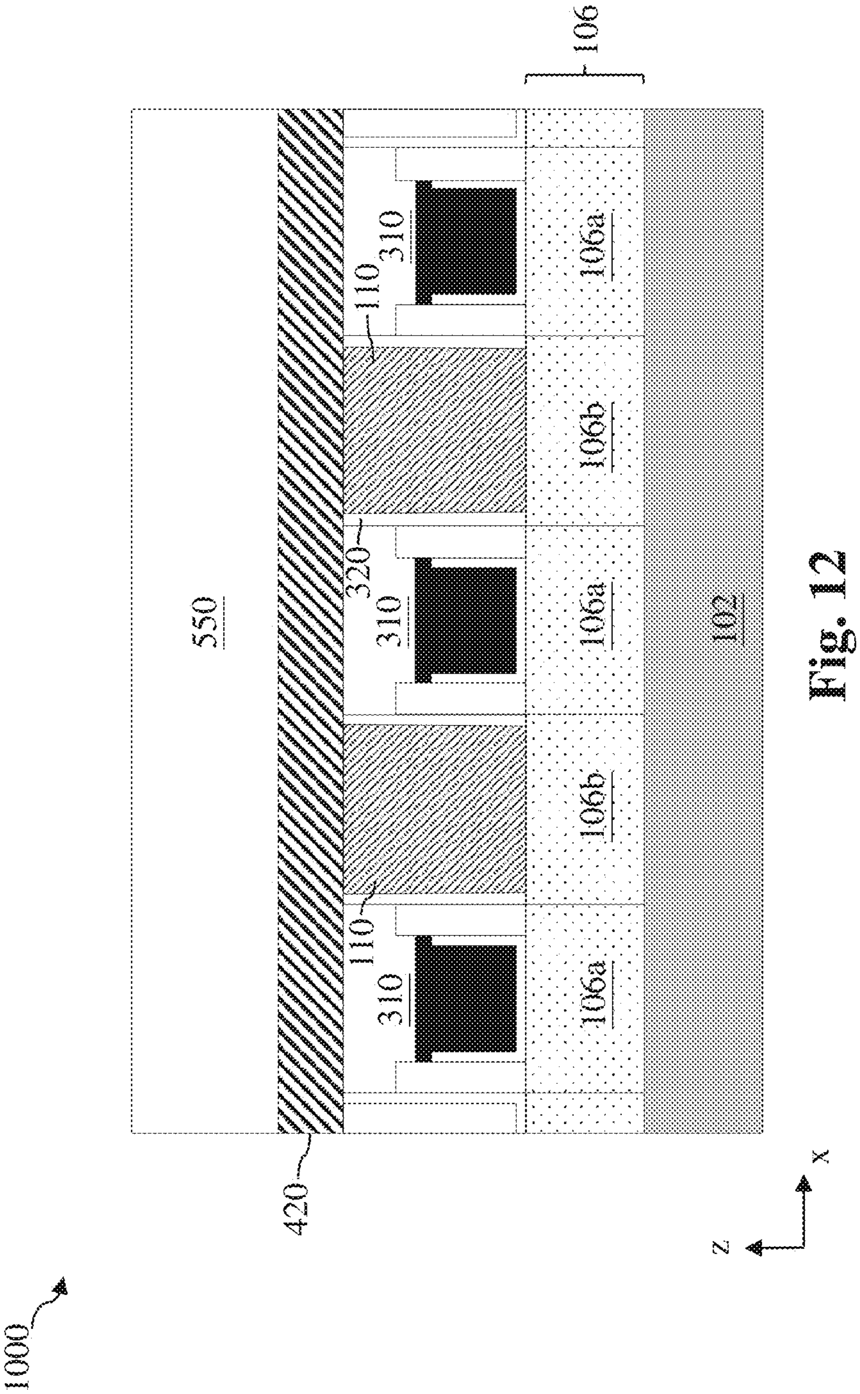
FIGS. 12-17 illustrate cross-sectional views of a semiconductor device cut along the lines B-B' in FIG. 10A at intermediate stages of fabrication and processed in accordance with the method of FIG. 11 according to an embodiment of the present disclosure.

At the end of operation 1208, with reference to FIG. 12, the semiconductor device 1000 shows an interlayer dielectric (ILD) layer 550 formed over a second CESL 420, much like the device 100 shown in FIG. 6. The difference is that at this stage of fabrication, the device 1000 also includes a second S/D contact 110 over a second S/D region 106*b*, whereas device 100 shows a first ILD layer 350 over the second S/D region 106*b*.

At operation 1210, the method 1200 performs a first patterning process to form gate via trenches (not shown) over gate structures 108 that exposes top surfaces of the metal gate stacks. The first patterning process may include one or more lithography and etching processes. In some embodiments, a lithography process is performed to form a patterned mask layer and an etching process uses the patterned mask layer as an etch mask when forming the gate via trenches. Due to differences in etching selectivity, the etching process may include a multi-etch process to separately etch the second ILD layer 550, the second CESL 420, and the dielectric caps 310. For example, as described above, the second CESL 420 and the dielectric caps 310 may have different materials causing etching selectivity to be greater than 10. As such, separate etching processes may be performed to separately etch these layers when forming gate via trenches to expose the gate electrodes 302 of the gate stacks 306.

Figure 13:
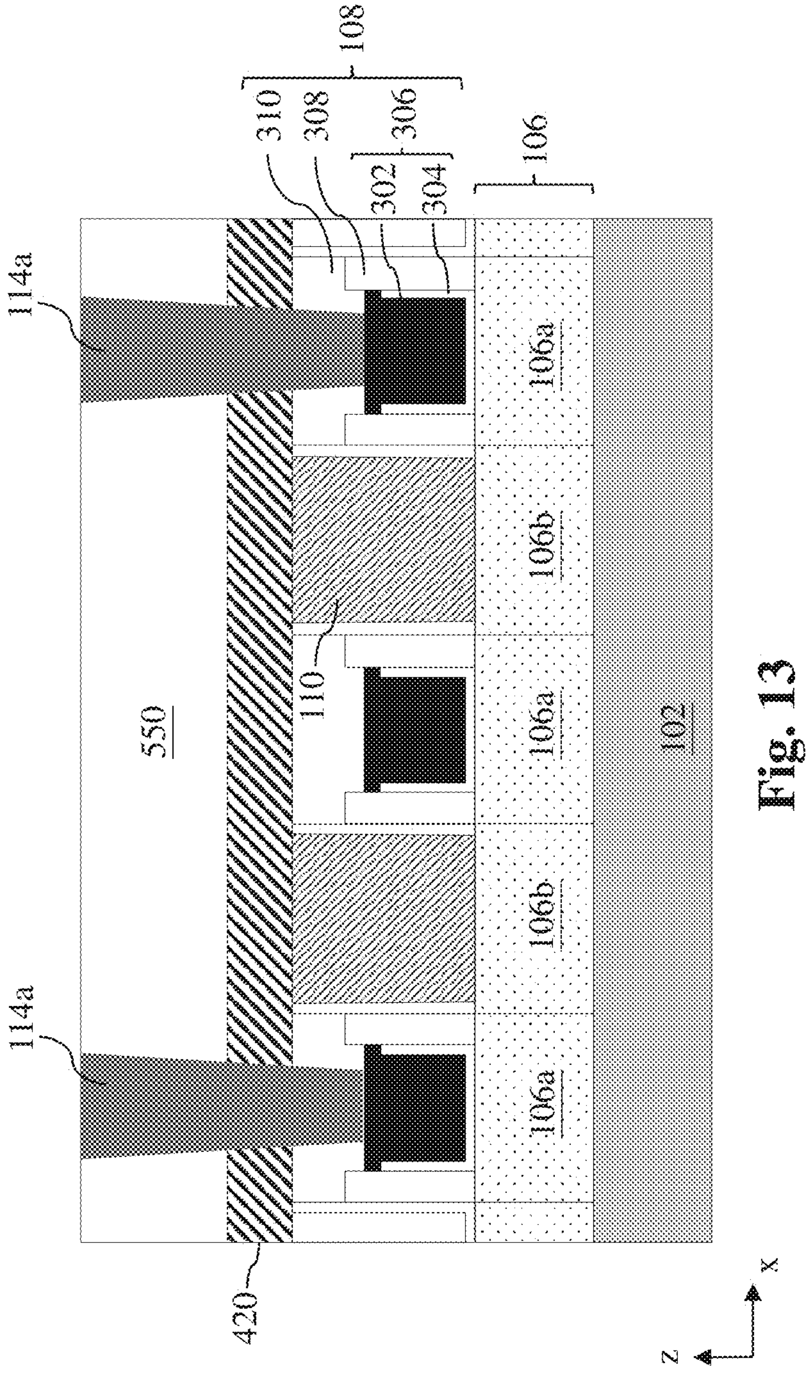

At operation 1212, the method 1200 form gate vias 114*a* in the gate via trenches, an embodiment of which is shown in FIG. 13. Since the gate vias 114*a* are small and have high aspect ratios, they may be formed by selective metal deposition having anisotropic metal growth and without a conductive barrier layer. This type of metal deposition may also be referred to as bottom up selective growth, where the deposited metal is grown substantially in the z direction without much growth in the x or y direction. The bottom up selective growth is achieved without first depositing a conductive barrier layer (or glue layer) in the gate via trenches. As such, the gate vias 114*a* are formed such that no conductive barrier layer such as titanium nitride surrounds the deposited metal. In an embodiment, the deposited metal forming the gate vias 114*a* is tungsten (W). In other embodiments, other suitable metal fill material such as such as aluminum (Al), titanium (Ti), ruthenium (Ru), copper (Cu), nickel (Ni), cobalt (Co), tantalum (Ta), or molybdenum (Mo) may be used.

Figure 14:
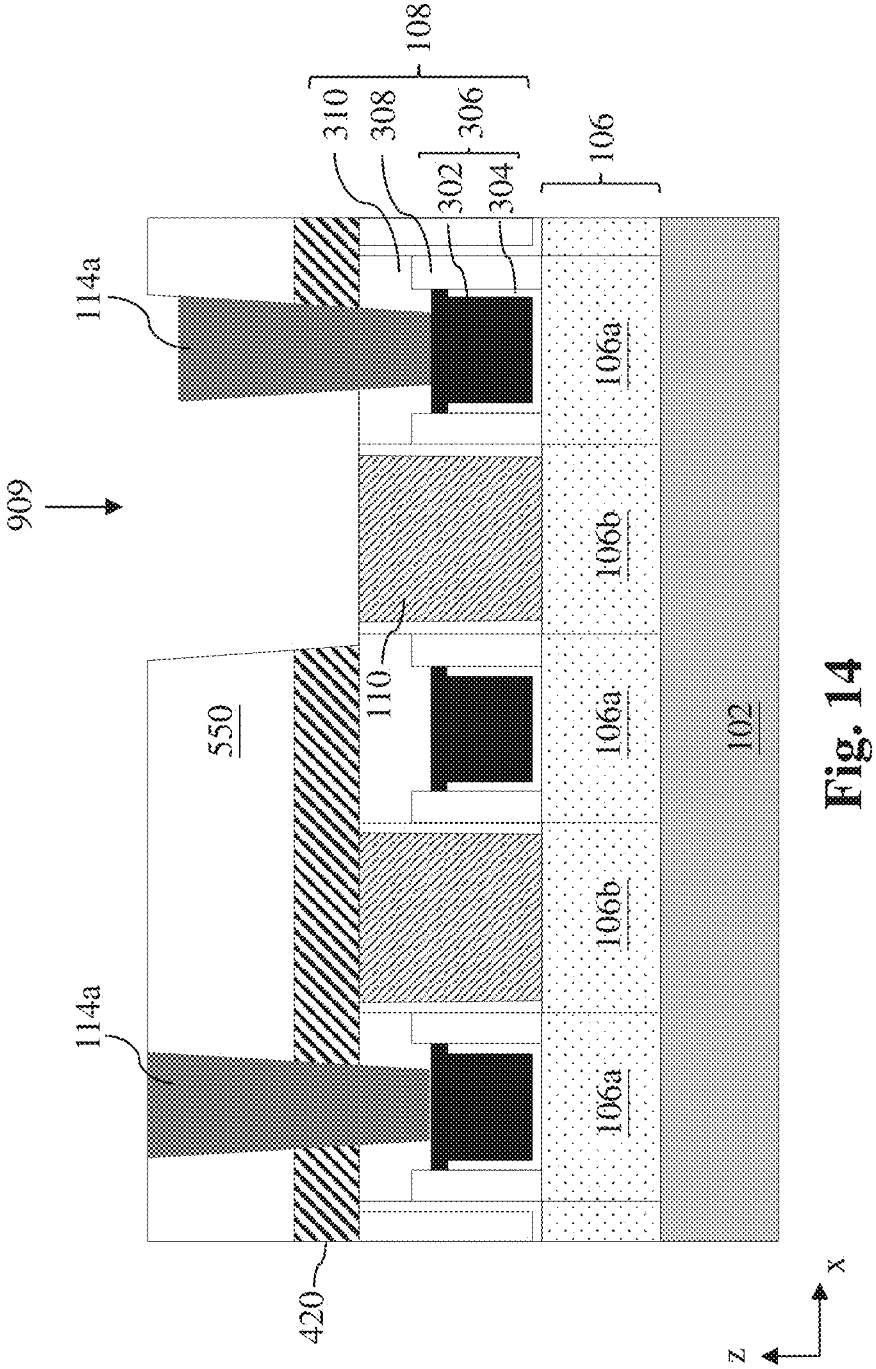

At operation 1214, the method 1200 performs a second patterning process to form first S/D via trenches 909, such as a first S/D via trench 909, an embodiment of which is shown in FIG. 14. The first S/D via trenches 909 penetrates through the ILD layer 550 and through the second CESL 420. The first S/D via trenches 909 expose top and side surfaces of a first plurality of the gate vias 114*a*. These gate vias 114*a*, such as a first gate via 114*a* on the right side of FIG. 15, may have an etch-back. The etch-back causes the first gate via 114*a* to have a top surface lower than a top surface of other gate vias 114*a* (such as a second gate via 114*a* on the left side of FIG. 15).

The second patterning process at operation 1214 may include one or more lithography and etching processes much like the first patterning process, except that each of the first S/D via trenches 909 is formed to be wider in the x direction, where the first S/D via trenches 909 fully expose top surfaces of a first plurality of S/D contacts 110. The first S/D via trenches 909 may also expose top surfaces of the dielectric caps 310, which acts as an effective etch stop layer due to the etching selectivity between the second CESL 420 and the dielectric caps 310 as described with respect to operation 210 of method 200. In an embodiment, an oxide recap is performed over the gate vias 114*a* and the ILD layer 550 before performing the second patterning process (not shown).

Figure 15:
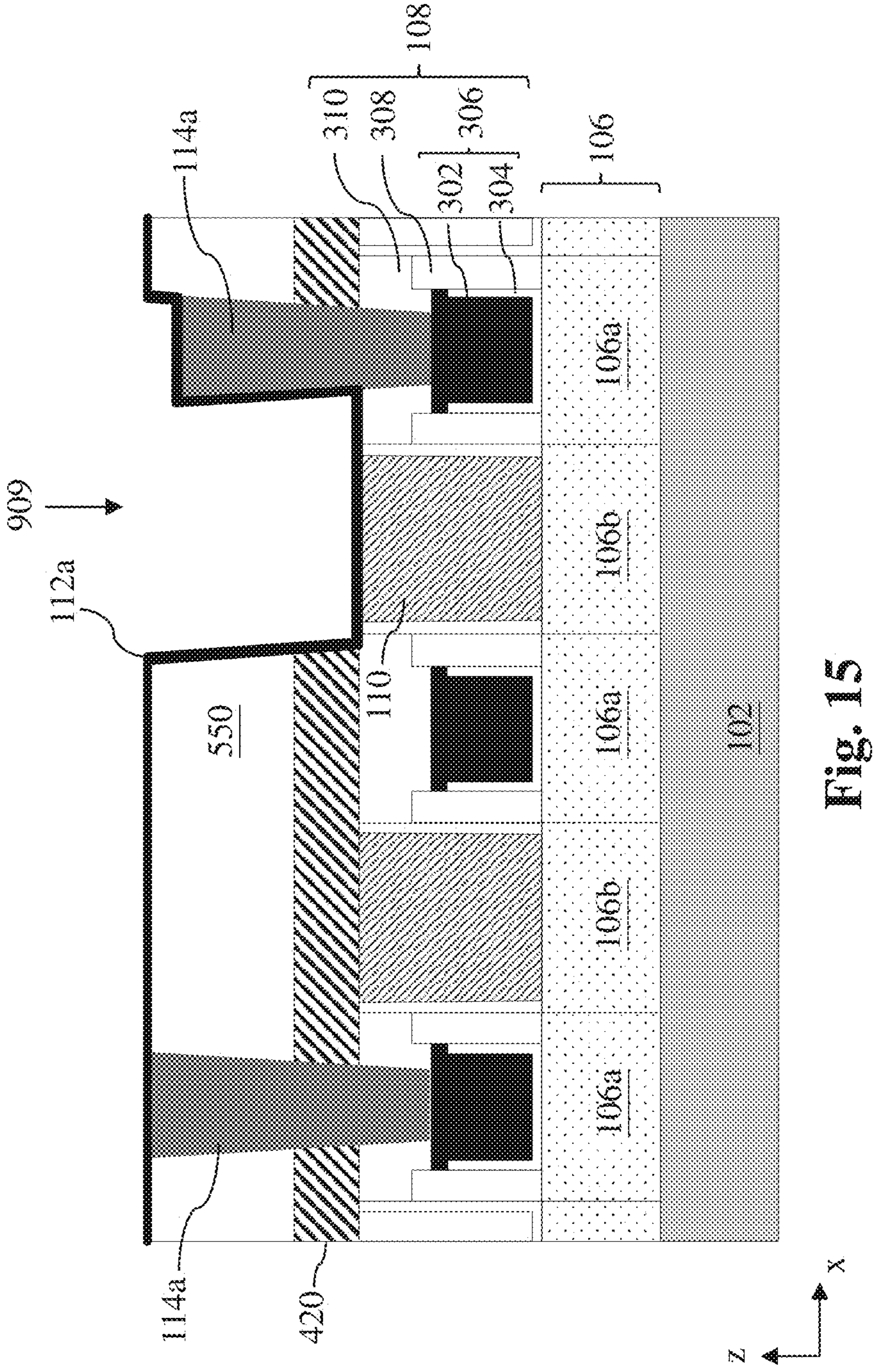
Figure 16:
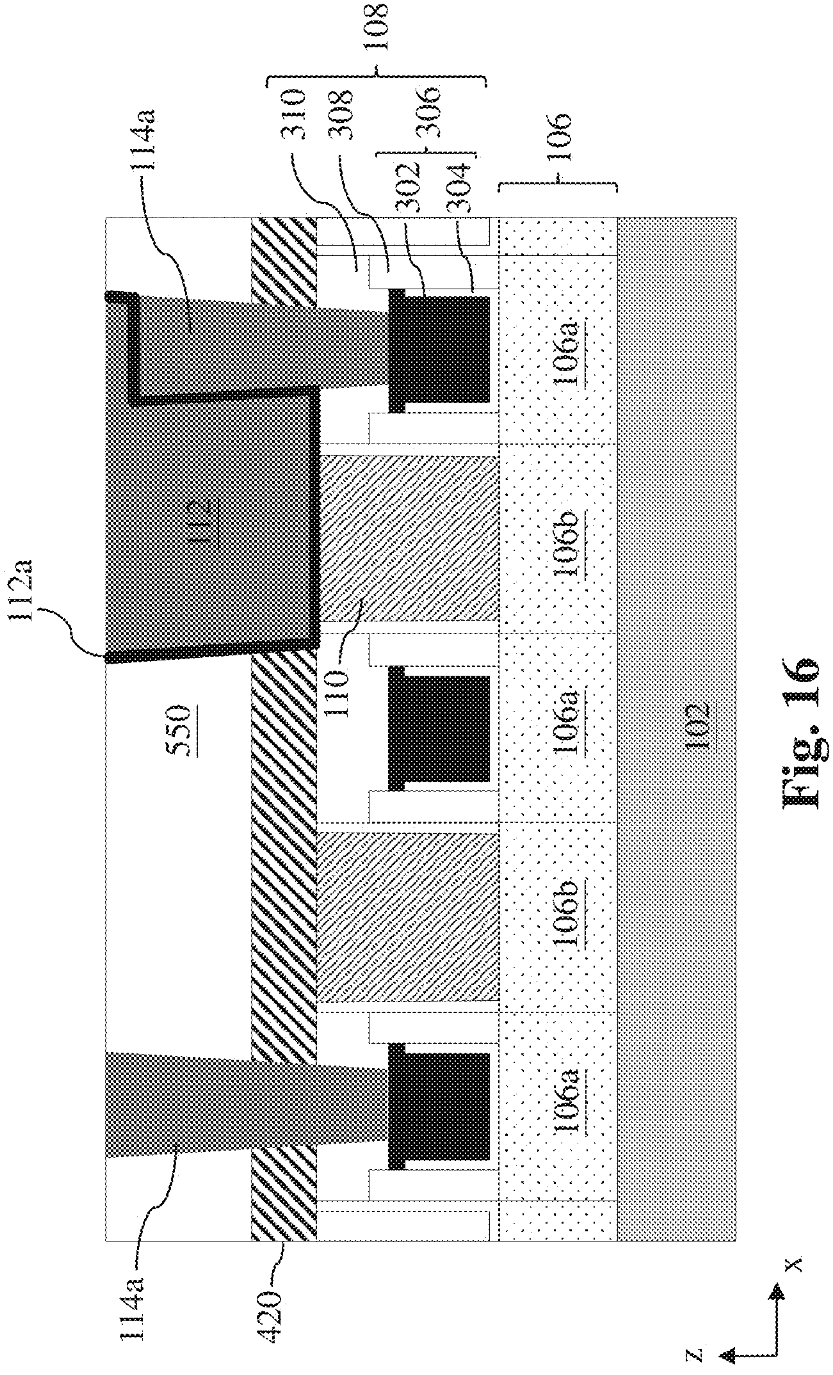

At operation 1216, the method 1200 forms first S/D vias 112 in the first S/D via trenches 909. FIGS. 15 and 16 illustrate example process steps of forming the first S/D vias 112. Since the first S/D vias 112 are formed to be bigger and wider having lower aspect ratio, they may be formed by metal deposition having isotropic metal growth and with a conductive barrier layer 112*a*. Now referring to FIG. 15, the isotropic metal growth is achieved by first conformally depositing a conductive barrier layer 112*a* in the first S/D via trenches 909. The conductive barrier layer 112*a* acts as a glue layer and may include titanium, titanium nitride, tantalum, tantalum nitride, or a combination thereof. The conductive barrier layer 112*a* lands on exposed top and side surfaces of the first plurality of the gate vias 114*a*, such as the first gate via 114*a* on the right side of FIG. 16. The conductive barrier layer 112*a* also lands on the top surface of the first S/D contact 110 adjacent to the first gate via 114*a*. Now referring to FIG. 16, a metal fill layer is deposited over the conductive barrier layer 112*a* to form the first S/D vias 112. The metal fill layer may include titanium (Ti), ruthenium (Ru), copper (Cu), nickel (Ni), cobalt (Co), tungsten (W), tantalum (Ta), molybdenum (Mo), or combinations thereof. The metal fill layer may be deposited by performing a CVD isotropic metal growth on the conductive barrier layer 112*a*. In an embodiment, the metal fill layer deposited is tungsten. Each of the first S/D vias 112 make full surface contact with one of the first plurality of the S/D contacts 110. The first S/D vias 112 may also make partial surface contact with two or more of the dielectric caps 310. Subsequent to forming the first S/D vias 112, a CMP process and/or other planarization process may be performed to etch away top portions of the conductive barrier layer 112*a* and to expose the gate vias 114*a* and first S/D vias 112.

At operation 1218, the method 1200 performs a third patterning process to form second S/D via trenches (not shown) through the ILD layer 550 and through the CESL 420. The third patterning process may include one or more lithography and etching processes. In some embodiments, a lithography process is performed to form a patterned mask layer and an etching process uses the patterned mask layer as an etch mask when forming the second S/D via trenches. The second S/D via trenches are formed to be narrower than the first S/D via trenches 909 in the x direction. The second S/D via trenches expose top surfaces of a second plurality of the S/D contacts 110. In an embodiment, the second S/D via trenches do not expose top surfaces of the dielectric caps 310. In another embodiment, the second S/D via trenches only partially expose top surfaces of the second plurality of the S/D contacts 110.

Figure 17:
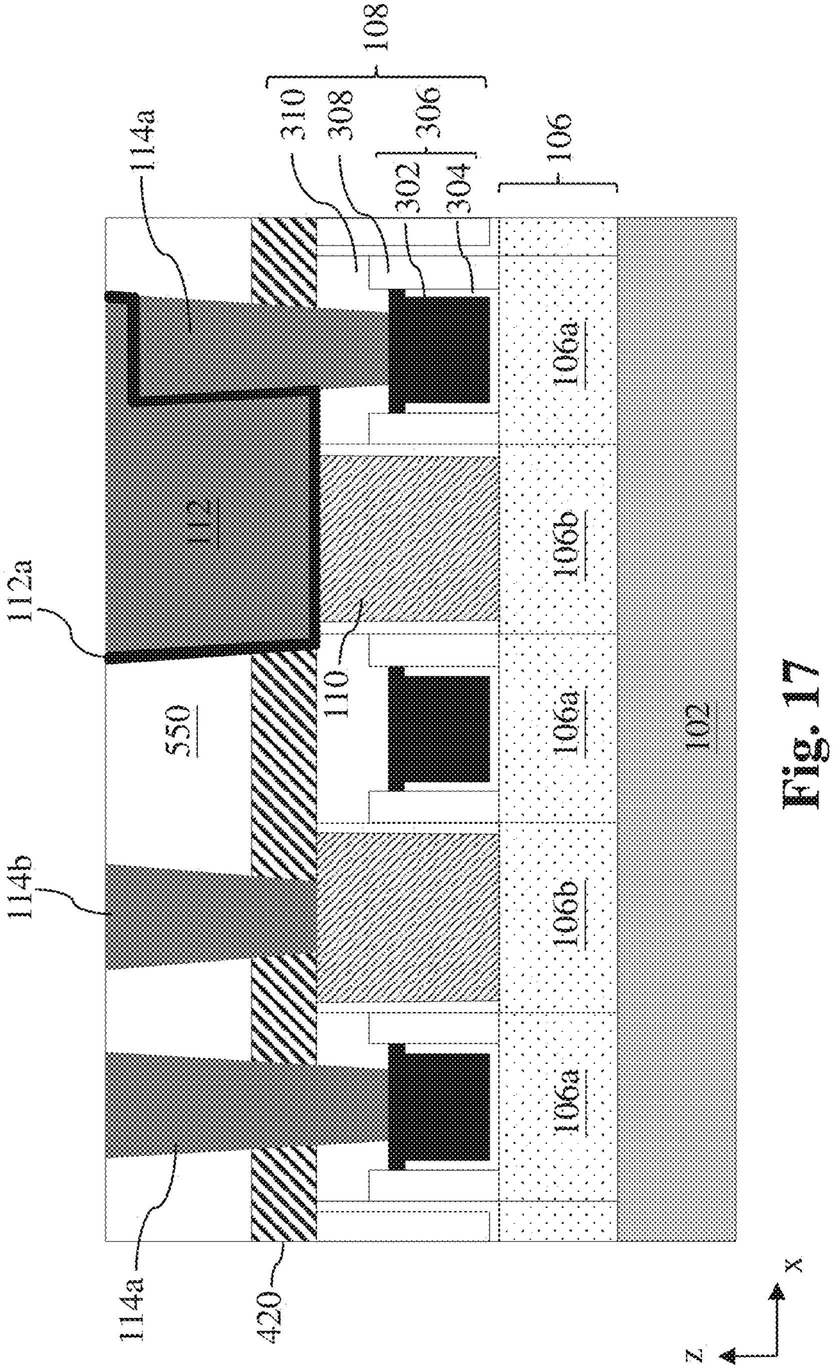

At operation 1220, the method 1200 forms second S/D vias 114*b* in the second S/D via trenches, an embodiment of which is shown in FIG. 17. Similar to the gate vias 114*a*, because the second S/D vias 114*b* are small and have high aspect ratios, they may be formed by selective metal deposition having anisotropic metal growth and without a conductive barrier layer. As described, this type of metal deposition may also be referred to as bottom up selective growth, where the deposited metal is grown substantially in the z direction without much growth in the x or y direction. The bottom up selective growth is achieved without first depositing a conductive barrier layer (or glue layer) in the gate via trenches. As such, the second S/D vias 114*b* are formed such that no conductive barrier layer such as titanium nitride surrounds the deposited metal. In an embodiment, the deposited metal forming the second S/D vias 114*b* is tungsten (W). In other embodiments, other suitable metal fill material such as such as aluminum (Al), titanium (Ti), ruthenium (Ru), copper (Cu), nickel (Ni), cobalt (Co), tantalum (Ta), or molybdenum (Mo) may be used. Note that the first S/D vias 112 and the second S/D vias 114*b* are formed in different process steps and by different metal growth schemes. As such, the first S/D vias 112 fully contact top surfaces of the S/D contacts 110, while the second S/D vias 114*b* may only partially contact top surfaces of the S/D contacts 110.

Although not limiting, the present disclosure offers advantages for semiconductor devices having source/drain (S/D) vias. One example advantage is that the S/D vias are formed to fully contact top surfaces of the S/D contacts. Another example advantage is that the S/D vias are elongated as slot vias or via rails, and they may be formed directly over the metal gate structures and contacting multiple S/D vias. Another example advantage is that a different type of contact etch stop layer is used to prevent undesired etching over the metal gates when forming the S/D vias. Another example advantage is that in processes related to static random access memory (SRAM) devices, the process of forming shared butted contacts between metal gate and source/drain contacts is eliminated by forming S/D vias to directly on gate vias.

One aspect of the present disclosure pertains to a method of forming a semiconductor device. The method includes receiving a workpiece having a first metal gate stack over a first channel region, a second metal gate stack over a second channel region, a source/drain (S/D) feature between the first and second channel regions, and an S/D contact over the S/D feature. The method includes forming first and second dielectric caps over the first and second metal gate stacks, respectively. The method includes forming a contact etch stop layer (CESL) over the S/D contact and over the first and second dielectric caps, where the CESL is different from the first and second dielectric caps in composition. The method includes forming an interlayer dielectric (ILD) layer over the CESL. The method includes performing a patterning process to form an S/D via trench through the ILD layer and through the CESL, where the patterning process includes a selective etching process using an etchant to selectively etch the CESL without substantially etching the first and second dielectric caps, and the S/D via trench fully exposes a top surface of the S/D contact and partially expose top surfaces of the first and second dielectric caps. The method includes forming an S/D via in the S/D via trench, wherein the S/D via makes full surface contact with the S/D contact and partial surface contact with the first and second dielectric caps.

In an embodiment, the S/D via has a length extending along a first direction from the first metal gate stack to the second metal gate stack, a width extending along a second direction perpendicular to the first direction, and the length is greater than the width. In a further embodiment, a ratio of the length to the width of the S/D via is greater than 2. In a further embodiment, the S/D via extends along the first direction over the first metal gate stack to make full surface contact with a second S/D contact over a second S/D feature, the second S/D feature being between the first channel region and a third channel region.

In an embodiment, the patterning process further includes an ILD etching process, wherein the ILD etching process is performed before the selective etching process, and the ILD etching process uses an etchant that etches the ILD layer to exposes a top surface of the CESL. In an embodiment, the CESL includes carbon and the first and second dielectric caps are free of carbon. In an further embodiment, the CESL is made of silicon carbonate (SiCO) or silicon carbonitride (SiCN), where the first and second dielectric caps is made of silicon nitride (SiN).

In an embodiment, the etchant used in the selective etching process has an etch selectivity greater than 10 when etching the CESL as compared to etching the first and second dielectric caps.

In an embodiment, the method further comprises forming gate spacers along sidewalls of the first and second metal gate stacks, where the first and second dielectric caps are directly over the first and second metal gate stacks and the gate spacers, where the CESL and the gate spacers are made of different materials and the selective etching process selectively etches the CESL without substantially etching the gate spacers.

Another aspect of the present disclosure pertains to a method of forming a semiconductor device. The method includes receiving a workpiece having a first metal gate stack over a first channel region, a second metal gate stack over a second channel region, a source/drain (S/D) feature between the first and second channel regions, and an S/D contact over the S/D feature. The method includes forming first and second dielectric caps covering and in direct contact with the first and second metal gate stacks, respectively. The method includes forming a contact etch stop layer (CESL) over the S/D contact and over the first and second dielectric caps, where the CESL and the first and second dielectric caps are made of different materials. The method includes forming an interlayer dielectric (ILD) layer over the CESL. The method includes forming a gate via trench through the ILD layer, through the CESL, and through the first dielectric cap, the gate via trench exposes a top surface of the first metal gate stack. The method includes forming a gate via in the gate via trench. The method includes forming an S/D via trench through the ILD layer and through the CESL, the S/D via trench exposes a top surface of the S/D contact and a side and a top surface of the gate via. The method includes forming an S/D via in the S/D via trench, wherein the S/D via lands on the top surface of the S/D contact and the side and top surfaces of the gate via.

In an embodiment, the gate via is formed by performing a first patterning process and a selective metal deposition having anisotropic metal growth, and the S/D via is formed by performing a second patterning process and an isotropic metal growth. In a further embodiment, sidewalls of the S/D contact are lined with a conductive barrier layer and the gate via is free of any conductive barrier layers.

In an embodiment, the workpiece further includes a third metal gate stack over a third channel region, a second S/D feature adjacent the third channel region, and a second S/D contact over the second S/D feature, the method further comprises: forming a third dielectric cap covering and in direct contact with the third metal gate stack; forming a second gate via trench through the ILD layer, through the CESL, and through the third dielectric cap, the second gate via trench exposes a top surface of the third metal gate stack; forming a second gate via in the second gate via trench; forming a second S/D via trench through the ILD layer and through the CESL, the second S/D via exposes a top surface of the second S/D contact; and forming a second S/D via in the second via trench. In a further embodiment, the second gate via and the second S/D via do not land on each other and are each formed by selective metal deposition having anisotropic metal growth. In a further embodiment, the first and second gate vias are simultaneously formed by a first patterning process.

Another aspect of the present disclosure pertains to a semiconductor device. The device includes metal gate stacks over channel regions of a substrate, gate spacers on sidewalls of the metal gate stacks, and dielectric caps landing on and covering the metal gate stacks and the gate spacers. The device further includes first etch stop layers on sidewalls of the gate spacers and the dielectric caps, source/drain (S/D) features between the channel regions of the substrate, S/D contacts between metal gate stacks and landing on the S/D features. The device further includes a second etch stop layer over the dielectric caps, the first etch stop layers, and the S/D contacts. The device further includes an interlayer dielectric (ILD) layer over the second etch stop layer and a first S/D via penetrating through the ILD layer and the second etch stop layer to make direct contact with multiple S/D contacts and multiple dielectric caps by extending lengthwise along a first direction. The second etch stop layer and the dielectric caps are made of different materials.

In an embodiment, the device further includes another S/D feature and another S/D contact landing on the another S/D feature; another gate stack being adjacent the another S/D feature; a gate via penetrating through the ILD layer and the second etch stop layer, and landing on one of the metal gate stacks; and a second S/D via landing on a top surface of the another S/D contact and the side and top surfaces of the gate via.

In an embodiment, wherein each of the metal gate stacks include a gate dielectric layer and a gate electrode, wherein the gate electrode includes a bottom portion and a top portion, the top portion of the gate electrode is disposed over a top surface of the gate dielectric layer, where top surfaces of the gate spacers are above top surfaces of the metal gate stacks.

In an embodiment, the dielectric caps and the first etch stop layers are made of silicon nitride, and the second etch stop layer is made of silicon carbonate or silicon carbonitride.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a semiconductor device, comprising:

receiving a workpiece having a first metal gate stack over a first channel region, a second metal gate stack over a second channel region, a source/drain (S/D) feature between the first and second channel regions, and an S/D contact over the S/D feature;

forming first and second dielectric caps over the first and second metal gate stacks, respectively;

forming a contact etch stop layer (CESL) over the S/D contact and over the first and second dielectric caps, wherein the CESL is different from the first and second dielectric caps in composition;

forming an interlayer dielectric (ILD) layer over the CESL;

performing a patterning process to form an S/D via trench through the ILD layer and through the CESL, wherein the patterning process includes a selective etching process using an etchant to selectively etch the CESL without substantially etching the first and second dielectric caps, and the S/D via trench fully exposes a top surface of the S/D contact and partially expose top surfaces of the first and second dielectric caps; and forming an S/D via in the S/D via trench, wherein the S/D via makes full surface contact with the S/D contact and partial surface contact with the first and second dielectric caps, wherein the S/D via has a length extending along a first direction from the first metal gate stack to the second metal gate stack, a width extending along a second direction perpendicular to the first direction, and the length is greater than the width.

2. The method of claim 1, wherein a ratio of the length to the width of the S/D via is greater than 2.

3. The method of claim 1, wherein the S/D via extends along the first direction over the first metal gate stack to make full surface contact with a second S/D contact over a second S/D feature, the second S/D feature being between the first channel region and a third channel region.

4. The method of claim 1, wherein the patterning process further includes an ILD etching process, wherein the ILD etching process is performed before the selective etching process, and the ILD etching process uses an etchant that etches the ILD layer to exposes a top surface of the CESL.

5. The method of claim 1, wherein the CESL includes carbon and the first and second dielectric caps are free of carbon.

6. The method of claim 5, wherein the CESL is made of silicon carbonate (SiCO) or silicon carbonitride (SiCN), wherein the first and second dielectric caps is made of silicon nitride (SiN).

7. The method of claim 1, wherein the etchant used in the selective etching process has an etch selectivity greater than 10 when etching the CESL as compared to etching the first and second dielectric caps.

8. The method of claim 1, further comprising forming gate spacers along sidewalls of the first and second metal gate stacks, wherein the first and second dielectric caps are directly over the first and second metal gate stacks and the gate spacers, wherein the CESL and the gate spacers are made of different materials and the selective etching process selectively etches the CESL without substantially etching the gate spacers.

9. The method of claim 8, further comprising forming dielectric layers adjacent the gate spacers, wherein the dielectric layers surround the S/D contact, wherein the CESL and the dielectric layers are made of different materials and the selective etching process selectively etches the CESL without substantially etching the dielectric layers.

10. The method of claim 1, wherein the S/D via has a bottom surface interfacing and coplanar with top surfaces of the first dielectric cap, the S/D contact, and the second dielectric cap.

11. A method of forming a semiconductor device, comprising:

receiving a workpiece having a first metal gate stack over a first channel region, a second metal gate stack over a second channel region, a source/drain (S/D) feature between the first and second channel regions, and an S/D contact over the S/D feature;

forming first and second dielectric caps covering and in direct contact with the first and second metal gate stacks, respectively;

forming a contact etch stop layer (CESL) over the S/D contact and over the first and second dielectric caps, wherein the CESL and the first and second dielectric caps are made of different materials;

forming an interlayer dielectric (ILD) layer over the CESL;

forming a gate via trench through the ILD layer, through the CESL, and through the first dielectric cap, the gate via trench exposes a top surface of the first metal gate stack;

forming a gate via in the gate via trench;

after the forming of the gate via, forming an S/D via trench through the ILD layer and through the CESL, the S/D via trench exposes a top surface of the S/D contact, a top surface of the first dielectric cap, and a side and a top surface of the gate via, wherein the gate via is partially etched when forming the S/D via trench; and forming an S/D via in the S/D via trench, wherein the S/D via lands on the top surface of the S/D contact and the side and top surfaces of the gate via.

12. The method of claim 11, wherein the gate via is formed by performing a first patterning process and a selective metal deposition having anisotropic metal growth; and the S/D via is formed by performing a second patterning process and an isotropic metal growth.

13. The method of claim 12, wherein sidewalls of the S/D contact are lined with a conductive barrier layer and the gate via is free of any conductive barrier layers.

14. The method of claim 11, wherein the workpiece further includes a third metal gate stack over a third channel region, a second S/D feature adjacent the third channel region, and a second S/D contact over the second S/D feature, the method further comprises:

forming a third dielectric cap covering and in direct contact with the third metal gate stack;

forming a second gate via trench through the ILD layer, through the CESL, and through the third dielectric cap, the second gate via trench exposes a top surface of the third metal gate stack;

forming a second gate via in the second gate via trench;

forming a second S/D via trench through the ILD layer and through the CESL, the second S/D via trench exposes a top surface of the second S/D contact; and forming a second S/D via in the second S/D via trench.

15. The method of claim 14, wherein the second gate via and the second S/D via do not land on each other and are each formed by selective metal deposition having anisotropic metal growth.

16. The method of claim 15, wherein the first and second gate vias are simultaneously formed by a first patterning process.

17. A method of forming a semiconductor device, comprising:

forming metal gate stacks over channel regions of a substrate;

forming gate spacers on sidewalls of the metal gate stacks;

forming dielectric caps landing on and covering the metal gate stacks and the gate spacers;

forming first etch stop layers on sidewalls of the gate spacers and the dielectric caps;

forming source/drain (S/D) features between the channel regions of the substrate;

forming S/D contacts between metal gate stacks and landing on the S/D features;

forming a second etch stop layer over the dielectric caps, the first etch stop layers, and the S/D contacts;

forming an interlayer dielectric (ILD) layer over the second etch stop layer; and forming a first S/D via penetrating through the ILD layer and the second etch stop layer to make full contact with a top surface of an S/D contact and partial contact with top surfaces of multiple dielectric caps by extending lengthwise along a first direction, wherein the second etch stop layer and the dielectric caps are made of different materials.

18. The method of claim 17, further comprising forming another S/D feature and another S/D contact landing on the another S/D feature;

forming another gate stack being adjacent the another S/D feature;

forming a gate via penetrating through the ILD layer and the second etch stop layer, and landing on one of the metal gate stacks; and forming a second S/D via landing on a top surface of the another S/D contact and the side and top surfaces of the gate via.

19. The method of claim 17, wherein each of the metal gate stacks include a gate dielectric layer and a gate electrode, wherein the gate electrode includes a bottom portion and a top portion, the top portion of the gate electrode is disposed over a top surface of the gate dielectric layer, wherein top surfaces of the gate spacers are above top surfaces of the metal gate stacks.

20. The method of claim 17, wherein the dielectric caps and the first etch stop layers are made of silicon nitride, and the second etch stop layer is made of silicon carbonate or silicon carbonitride.

* * * * *